United States Patent
Matsumoto et al.

(10) Patent No.: US 11,424,276 B2
(45) Date of Patent: Aug. 23, 2022

(54) PHOTOELECTRIC CONVERSION DEVICE, IMAGE READING DEVICE AND IMAGE FORMING APPARATUS

(71) Applicants: Kenichi Matsumoto, Hyogo (JP); Yuuya Miyoshi, Osaka (JP)

(72) Inventors: Kenichi Matsumoto, Hyogo (JP); Yuuya Miyoshi, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 156 days.

(21) Appl. No.: 16/929,536

(22) Filed: Jul. 15, 2020

(65) Prior Publication Data

US 2021/0036037 A1    Feb. 4, 2021

(30) Foreign Application Priority Data

Jul. 31, 2019    (JP) .............................. JP2019-141788

(51) Int. Cl.
| | |
|---|---|
| *H01L 27/146* | (2006.01) |
| *H04N 5/369* | (2011.01) |
| *H04N 1/028* | (2006.01) |
| *H04N 5/378* | (2011.01) |

(52) U.S. Cl.
CPC .. *H01L 27/14603* (2013.01); *H01L 27/14621* (2013.01); *H01L 27/14636* (2013.01); *H01L 27/14645* (2013.01); *H04N 1/02805* (2013.01); *H04N 1/02815* (2013.01); *H04N 5/3698* (2013.01); *H04N 5/378* (2013.01)

(58) Field of Classification Search
CPC ......... H01L 27/14603; H01L 27/14645; H01L 27/146; H01L 27/14618; H01L 27/14609; H01L 27/14621; H01L 27/14632; H01L 27/14636; H01L 27/1225; H01L 27/14601; H01L 29/78603; H01L 29/78648; H01L 29/78651; H01L 29/7869; H01L 29/78696; H04N 5/3698; H04N 5/378; H04N 1/02815; H04N 5/3577; H04N 5/3658; H04N 5/3741; H04N 5/37452; H04N 5/37455; H04N 5/37457; H04N 1/02805; H04N 5/3745; H04N 5/379
USPC ........................................................ 358/482
See application file for complete search history.

(56) References Cited

U.S. PATENT DOCUMENTS

| | | | |
|---|---|---|---|
| 10,535,687 B2 * | 1/2020 | Azami ................. | H01L 27/146 |
| 10,546,898 B2 * | 1/2020 | Otake ................ | H04N 9/04559 |
| 2005/0264665 A1 * | 12/2005 | Endo ..................... | H04N 5/378 |
| | | | 348/308 |

(Continued)

FOREIGN PATENT DOCUMENTS

WO    WO2017/154388 A1    9/2017

*Primary Examiner* — Negussie Worku
(74) *Attorney, Agent, or Firm* — IPUSA, PLLC

(57) ABSTRACT

A photoelectric conversion device includes: a photoelectric conversion block including two-dimensionally arranged photoelectric converters, each photoelectric converter including a color filter and a photoelectric conversion element configured to perform photoelectric conversion in response to incident light; a signal processing block configured to process data output from the photoelectric conversion block; and a plurality of electrode pads disposed in the signal processing block. The electrode pads are configured to supply power to the photoelectric conversion block and the signal processing block.

17 Claims, 21 Drawing Sheets

(56) References Cited

U.S. PATENT DOCUMENTS

| | | | |
|---|---|---|---|
| 2006/0180742 A1* | 8/2006 | Kwon | H04N 5/374 348/E3.021 |
| 2009/0072806 A1* | 3/2009 | Shiota | G06F 1/26 323/283 |
| 2010/0097486 A1* | 4/2010 | Iwane | H04N 9/04557 348/222.1 |
| 2010/0301466 A1* | 12/2010 | Taoka | H01L 24/97 257/E23.173 |
| 2013/0162870 A1 | 6/2013 | Miyoshi et al. | |
| 2016/0204058 A1* | 7/2016 | Oyamada | H01L 23/49838 257/778 |
| 2016/0358958 A1 | 12/2016 | Miyoshi et al. | |
| 2017/0171483 A1 | 6/2017 | Kudoh et al. | |
| 2017/0244844 A1 | 8/2017 | Miyoshi et al. | |
| 2017/0264844 A1 | 9/2017 | Kamezawa et al. | |
| 2017/0272742 A1 | 9/2017 | Suzuki et al. | |
| 2018/0184030 A1* | 6/2018 | Ikeda | H01L 29/78696 |
| 2018/0249107 A1 | 8/2018 | Kamezawa et al. | |
| 2018/0367749 A1* | 12/2018 | Miyoshi | H04N 5/378 |
| 2019/0028665 A1 | 1/2019 | Miyoshi et al. | |
| 2019/0260954 A1* | 8/2019 | Tamaki | H04N 5/378 |
| 2019/0268496 A1 | 8/2019 | Nakazawa et al. | |
| 2019/0393252 A1 | 12/2019 | Miyoshi et al. | |
| 2021/0036037 A1* | 2/2021 | Matsumoto | H01L 27/14609 |
| 2021/0360180 A1* | 11/2021 | Saito | H01L 27/14603 |
| 2022/0011879 A1* | 1/2022 | Saito | G06F 1/169 |
| 2022/0020795 A1* | 1/2022 | Lee | H01L 27/14603 |
| 2022/0155903 A1* | 5/2022 | Saito | H01H 3/02 |

* cited by examiner

PHOTOELECTRIC CONVERSION DEVICE, IMAGE READING DEVICE AND IMAGE FORMING APPARATUS

CROSS-REFERENCE TO RELATED APPLICATIONS

This patent application is based on and claims priority pursuant to 35 U.S.C. § 119(a) to Japanese Patent Application No. 2019-141788, filed on Jul. 31, 2019, in the Japan Patent Office, the entire disclosure of which is hereby incorporated by reference herein.

BACKGROUND

Technical Field

Embodiments of the present disclosure relate to a photoelectric conversion device, an image reading device, and an image forming apparatus.

Related Art

Typical photoelectric conversion devices include a pixel block, in which pixels are two-dimensionally arranged, and a plurality of signal processors each configured to process a signal output from the pixel block. Each pixel includes a photoelectric conversion element configured to photoelectrically convert incident light into electrical charges and a charge-voltage converter configured to convert the photoelectrically-converted electrical charges into voltage. Such a configuration includes a complementary metal oxide semiconductor (CMOS) that is advantageous for producing a single integrated unit. Further, such photoelectric conversion devices are used as image sensors in various image capturing apparatuses, such as video cameras, digital cameras, and copiers.

There is a demand for the image sensors mounted on the image capturing apparatuses to achieve a reduction in noise while meeting the limited layout area of a substrate on which an image sensor is arranged, so as to achieve higher image quality.

SUMMARY

In one aspect of this disclosure, there is described a photoelectric conversion device including: a photoelectric conversion block including two-dimensionally arranged photoelectric converters, each photoelectric converter including a color filter and a photoelectric conversion element configured to perform photoelectric conversion in response to incident light; a signal processing block configured to process data output from the photoelectric conversion block; and a plurality of electrode pads disposed in the signal processing block, the electrode pads configured to supply power to the photoelectric conversion block and the signal processing block.

In another aspect of this disclosure, there is described an image reading device including: a light source configured to emit light to a document; and the above-described light photoelectric conversion device to perform photoelectric conversion on the light reflected from the document.

Further described is an image forming apparatus including: a light source configured to emit light to a document; the above-described photoelectric conversion device to perform photoelectric conversion on light reflected from the document; and a printer engine configured to form an image based on data output from the photoelectric conversion device.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
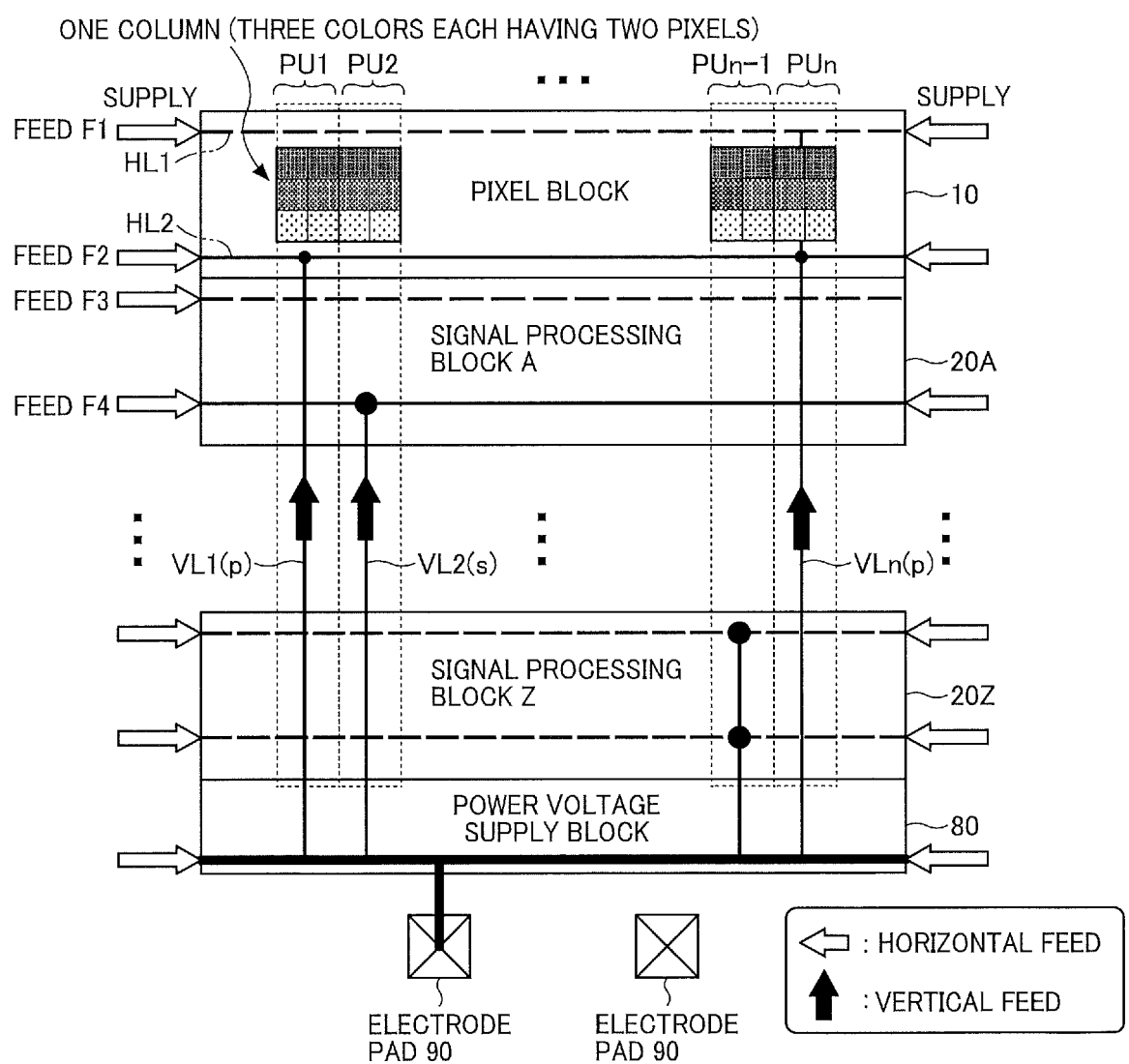
FIG. 1 is a diagram of an electrode pad and electrode wiring according to a comparative example.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Figure 2:
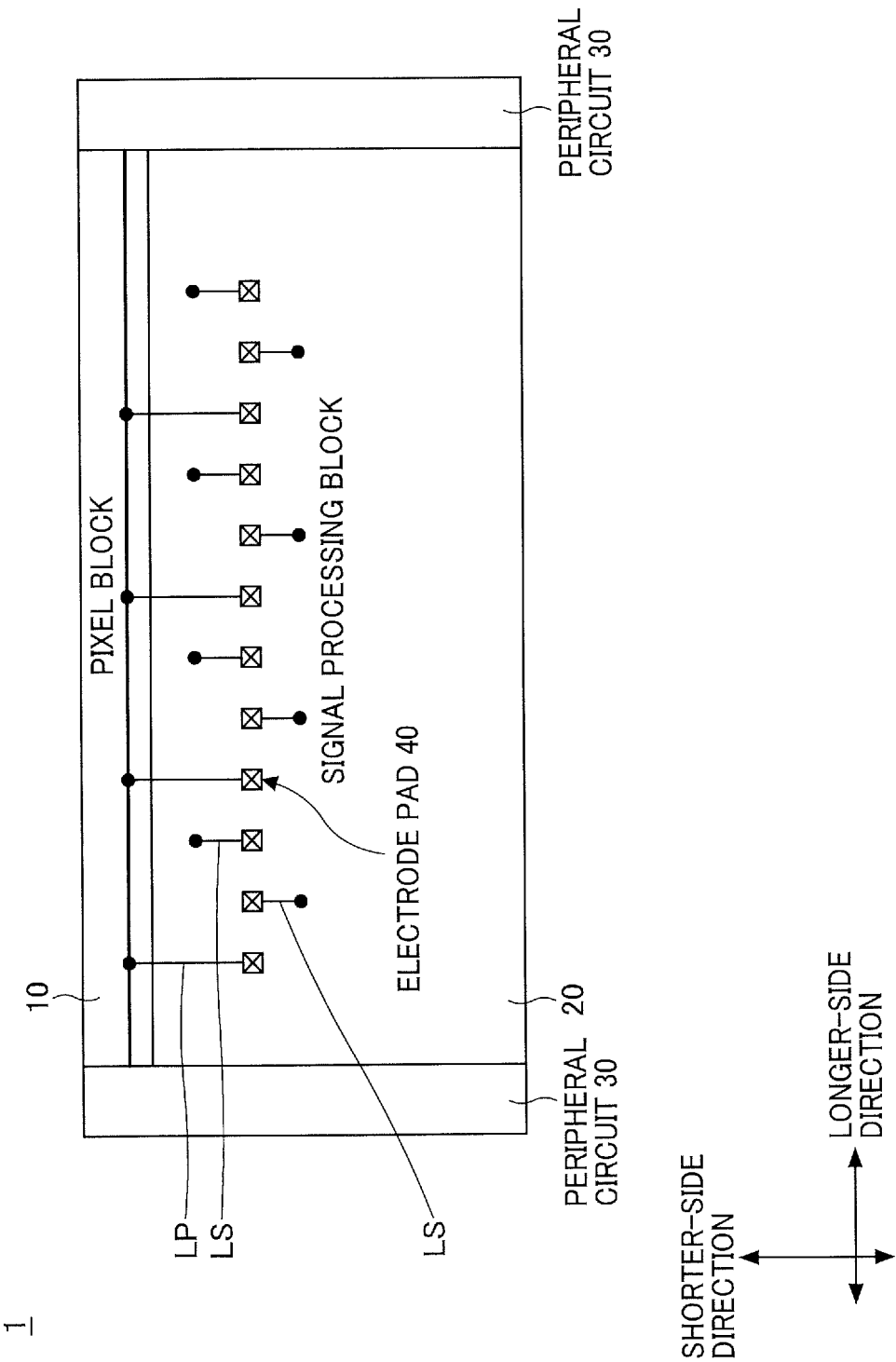
FIG. 2 is a schematic diagram of the electrode pads and electrode wiring in a photoelectric conversion chip according to an embodiment of the present disclosure.

The schematic configuration of a photoelectric conversion chip 1 according to an embodiment of the present disclosure is described with reference to FIG. 2. FIG. 2 is a schematic diagram of an electrode pad and electrode wiring in a photoelectric conversion chip 1 according to an embodiment of the present disclosure.

In the configuration in FIG. 2, the photoelectric conversion chip 1, which is a photoelectric conversion device, includes a pixel block 10, a signal processing block 20, two peripheral circuits 30, and electrode pads 40. The electrodes pads 40 are arranged within the signal processing block 20, and the electrode wiring is provided from the electrode pads to the pixel block 10 and the signal processing block 20.

The photoelectric conversion chip 1 in FIG. 2 has a laterally oriented rectangular shape. The pixel block 10 and the signal processing block 20 extend in the longer-side direction (the lateral direction or a first direction) of the photoelectric conversion chip 1 and are arranged in the shorter-side direction (the longitudinal direction or a second direction). The two peripheral circuits 30 extend in the shorter-side direction, and the pixel block 10 and the signal processing block 20 are disposed between the peripheral circuits 30.

The pixel block 10, which is a photoelectric conversion block, includes a color filter and two-dimensionally arranged pixels each including a photoelectric conversion element to photoelectrically convert incident light into an electrical signal and a charge-voltage conversion unit to convert the photoelectrically-converted charges into voltage.

The signal processing block 20 processes output of the pixel block 10. The signal processing block 20 includes, for example, an amplifier block and an analog voltage (A/D) converter block. The amplifier block amplifies a plurality of signals output from the pixel block 10.

The plurality of electrode pads 40 arranged in the signal processing block 20 supply power to the pixel block 10 and the signal processing block 20, respectively. In FIG. 2, a wiring line LP (signal line) supplies power from an electrode pad 40 to the pixel block 10 (photoelectric conversion block), and a wiring line LS supplies power from an electrode pad 40 to the signal processing block 20.

As illustrated in FIG. 2, the electrode pads 40 are apart from the end (the lower end in FIG. 2) of the photoelectric conversion chip 1 and also from the pixel block 10 within the signal processing block 20.

Such a wiring arrangement enables a reduction in the resistance of the wiring lines LP leading to the pixel block 10 unlike the case in which the electrode pads 40 are arranged close to the end of the photoelectric conversion chip 1 because the electrode pads 40 are relatively close to the pixel block 10 although the wiring lines LP pass through the signal processing block 20.

That wiring arrangement also enables a reduction in the resistance of the wiring lines LS, which supply power from the electrode pads 40 to the signal processing block 20, because the electrode pads 40 are near the circuit of the signal processing block 20. This configuration advantageously reduces the need for additional layout space, which further prevents an increase in the area of the photoelectric conversion chip 1. In other words, the configuration according to an embodiment of the present disclosure enables a reduction int he layout area within the photoelectric conversion device.

Figure 3:
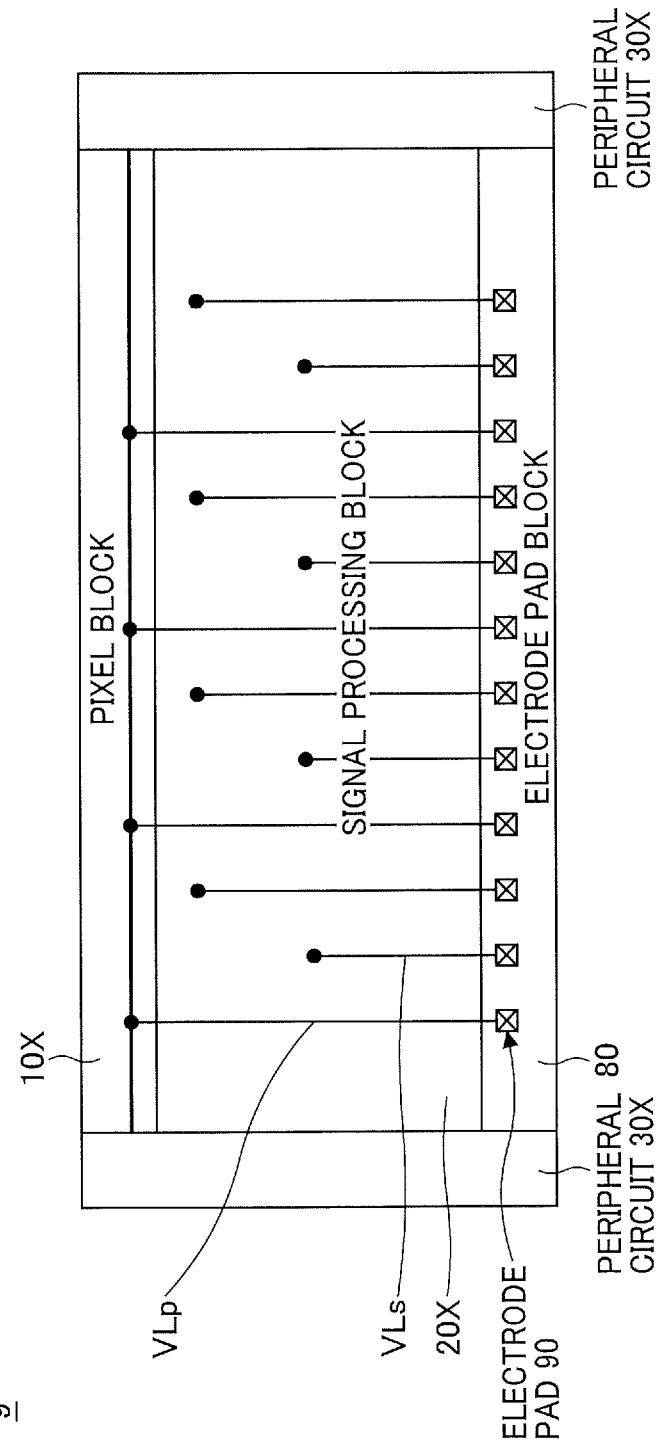
FIG. 3 is a diagram of the electrode pads and electrode wiring in a photoelectric conversion chip according to a comparative example in which the electrode pads are disposed near the end of the photoelectric conversion chip.
Figure 4:
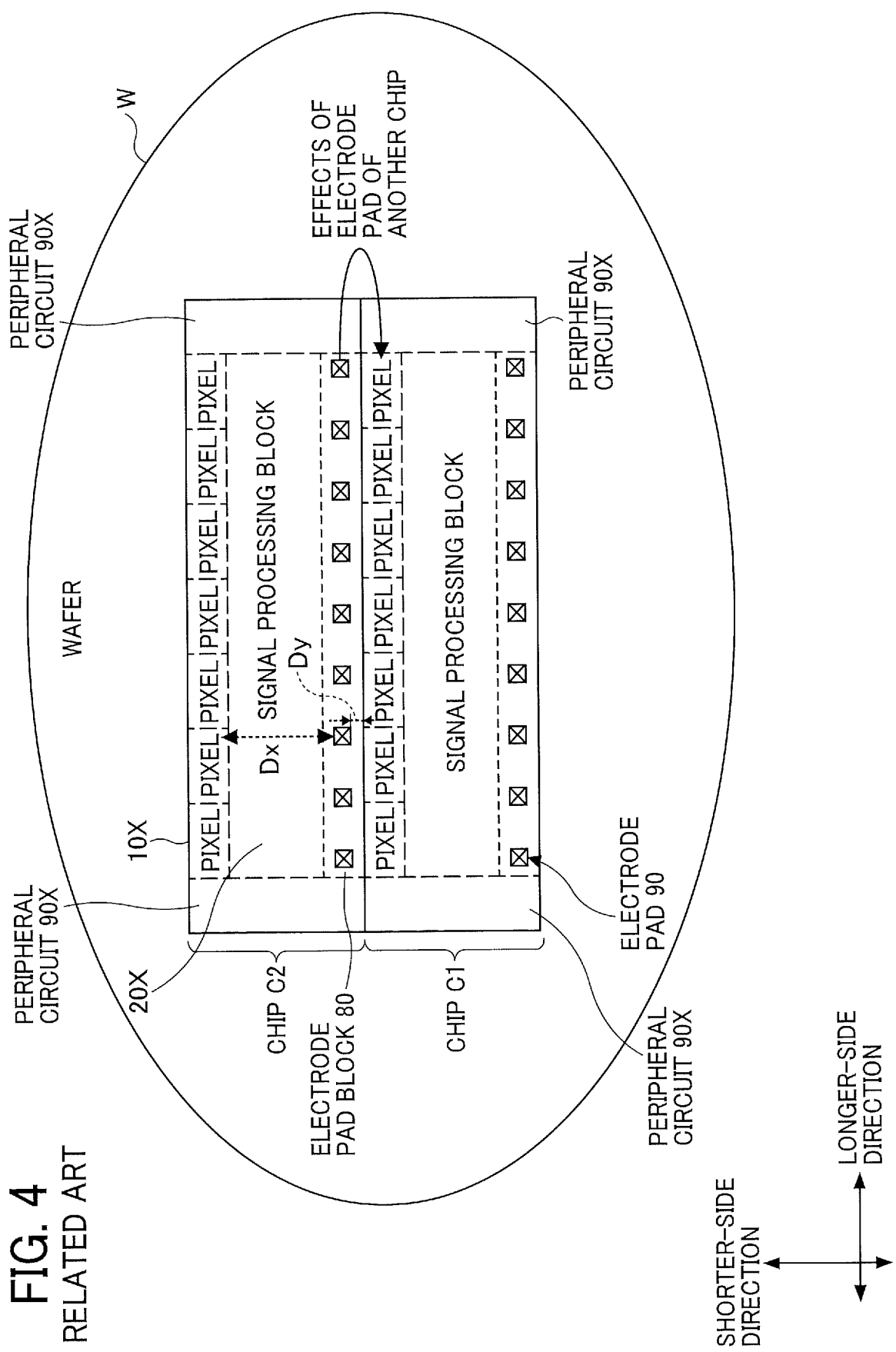
FIG. 4 is a diagram of a wafer of a plurality of photoelectric conversion chips according to the comparative example in FIG. 3.
Figure 5:
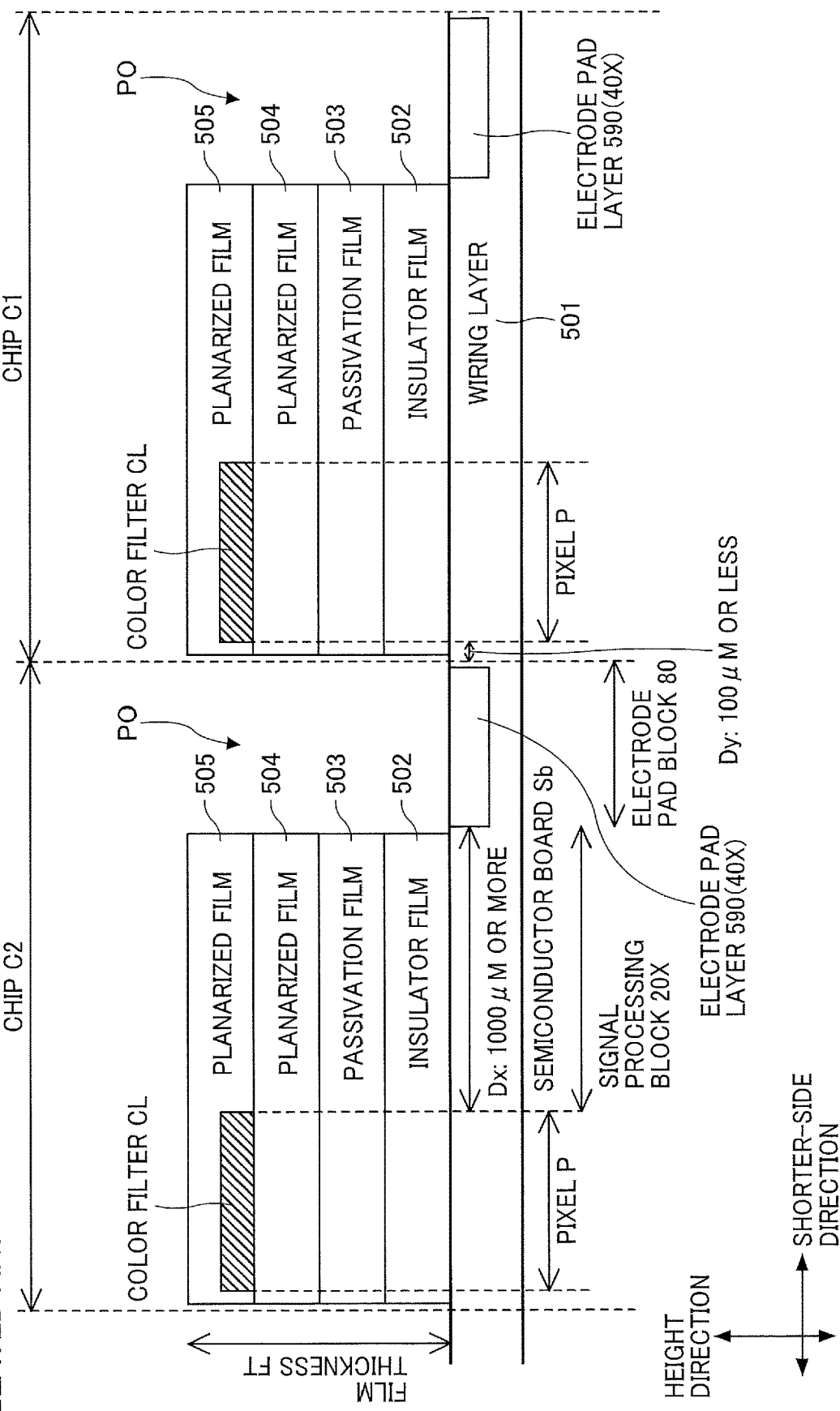
FIG. 5 is a longitudinal cross-sectional view of the wafer of the plurality of photoelectric conversion chips in FIG. 4.

The following describes the issues of the comparative examples with reference to FIGS. 3 to 5.

FIG. 3 is a diagram of the electrode pads 90 and electrode wiring in a photoelectric conversion chip 9 according to a comparative example in which the electrode pads 90 are disposed near the end of the photoelectric conversion chip 9.

The photoelectric conversion chip 9 according to the comparative example in FIG. 3 includes a signal processing block 20X and an electrode pad block 80, which is separate from the signal processing block 20X, at the end (the lower end in FIG. 3) of the photoelectric conversion chip 9. The electrode pad block 80 includes electrode pads 90, and the wiring lines are provided from the electrode pads 90 to the pixel block 10 and the signal processing block 20.

Each wiring lines VLp, for example, is connected from an electrode pad 90 to the pixel block 10 through the signal processing block 20X between the pixel block 10X and the electrode pad block 80. Each wiring line of the electrode wiring preferably has a low resistance in view of the properties and characteristics of the wiring line, and the width of a wiring line and the number of wiring lines VLp and VLs are increased to reduce the resistance of the wiring lines. Such measures, however, reduce layout space within the signal processing block 20X and need an additional layout space, which increases a layout area and cost accordingly.

FIG. 4 is a diagram of a wafer of a plurality of photoelectric conversion chips 9 according to the comparative example in FIG. 3. FIG. 5 is a longitudinal cross-sectional view of the wafer of the plurality of photoelectric conversion chips in FIG. 4. The aspect ratio of each film in FIG. 5 is different from the actual aspect ratio.

In the example of FIG. 4 in which the electrode pads 90 are disposed near the end of each photoelectric conversion chip 9, the electrode pads 90 are apart from the pixel block 10X within one chip, but the electrode pads 90 in a chip C2 adjacent to a chip C1 are close to the pixel block 10X in the chip C1 within the wafer of the chips as a whole.

In this arrangement, an electrode pad layer 590 (see FIG. 5) of each electrode pads 90 is close to a pixel P of the pixel block 10X, which might cause non-uniformity in the color filter. In the process of producing an electrode pad 90, an insulator film 502 and a passivation film 503 are formed on a wiring layer 501, and these films are removed to form an electrode pad layer 590, thus forming a pad opening PO. The electrode pad layer 590 is disposed in a recessed area whose level is lower than the level of the other laminated layers, which means that there is a difference in level between the recessed area and the other area. Further, planarized films 504 and 505 made of, for example, resin material are applied onto the passivation film 503 through spin coating so that a color filter and an on-chip microlens are disposed on the planarized films 504 and 505.

Unevenness might occur in the planarized films 504 and 505 due to the pad opening PO that defines the difference in level between the top surface of the electrode pad layer 590 and the other area during the spin coating. The degree of such an unevenness increases as the pixels are closer to the pad opening PO. If the distance from the pad opening PO to the color filter CL and the on-chip microlenses is short, non-uniformity in the color filter and the on-chip microlens might occur, and the transmittance and the conversion gain differ between the pixels. Thus, the properties and characteristics of the pixels might be adversely affected. As the film thickness FT of the laminated layers, which corresponds to the difference in level between the electrode pad layer 590 and the laminated layers in the pixel block, increases, the range of non-uniformity in the color filter increases.

In each of the chips C1 and C2 in FIG. 5, for example, the distance Dx between the pixel P and the electrode pad layer 590 in the longitudinal direction (shorter-side direction) is 1000 μm or more. The pixel P of the chip C1 and the electrode pad layer 590 of the chip C2 adjacent to the chip C1, however, are close to each other, and the distance Dy between the pixel P of the chip C1 and the electrode pad layer 590 of the chip C2 in the longitudinal direction is, for example, 100 μm or less. The film thickness FT corresponding to the difference in level between the electrode pad layer 590 and the laminated layers, which is defined by the pad opening PO, is, for example, 1.25 μm.

It is commonly known in the art that if the pixel P is separated from the electrode pad by a distance of 100 times or more the film thickness FT corresponding to the step height from the top surface of the electrode pad layer 590, the uniformity in the color filter is not affected. This configuration, however, still might cause non-uniformity in the color filter CL due to the difference in level between the laminated layers and the top surface of the electrode pad layer because the distance between the pixels P of the pixel block 10X in a chip and the electrode pads 90 in another chip adjacent to the chip in the longitudinal direction is about eighty times the film thickness FT.

Figure 6:
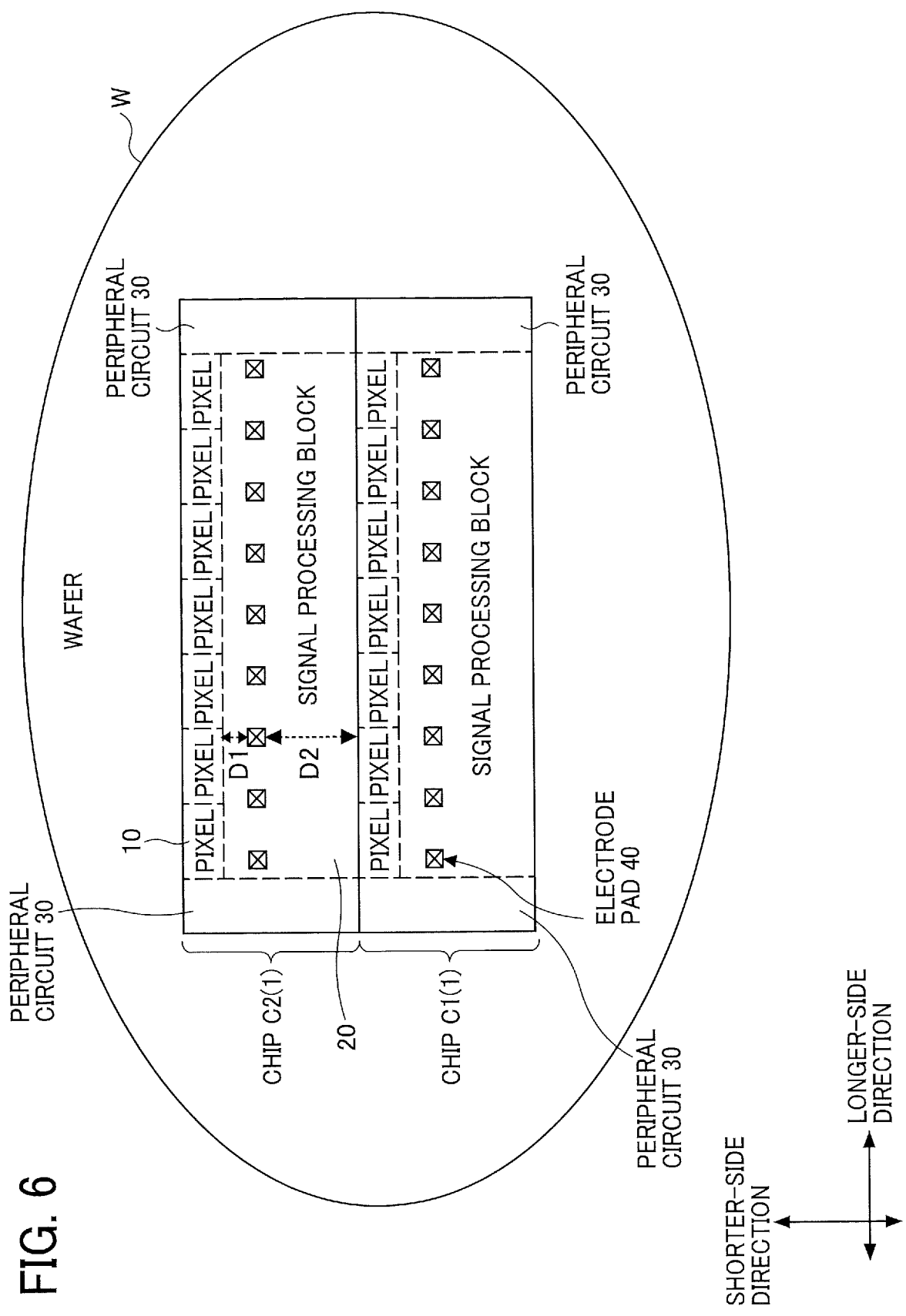
FIG. 6 is a diagram of a wafer of a plurality of photoelectric conversion chips in FIG. 2.

FIG. 6 is a diagram of a wafer W of a plurality of photoelectric conversion chips 1 in FIG. 2. In the present embodiment as illustrated in FIG. 6, the pixel block 10 is sufficiently spaced apart by a distance D1 from the electrode pads 40 arranged in the signal processing block 20 within one chip. Further, the pixel block 10 of the chip C1, i.e., the end of the chip C1, is sufficiently spaced apart by a distance D2 from the electrode pads 40 of the chip C2 within the wafer W in which a plurality of chips C1 and C2 are arranged side by side.

Figure 7:
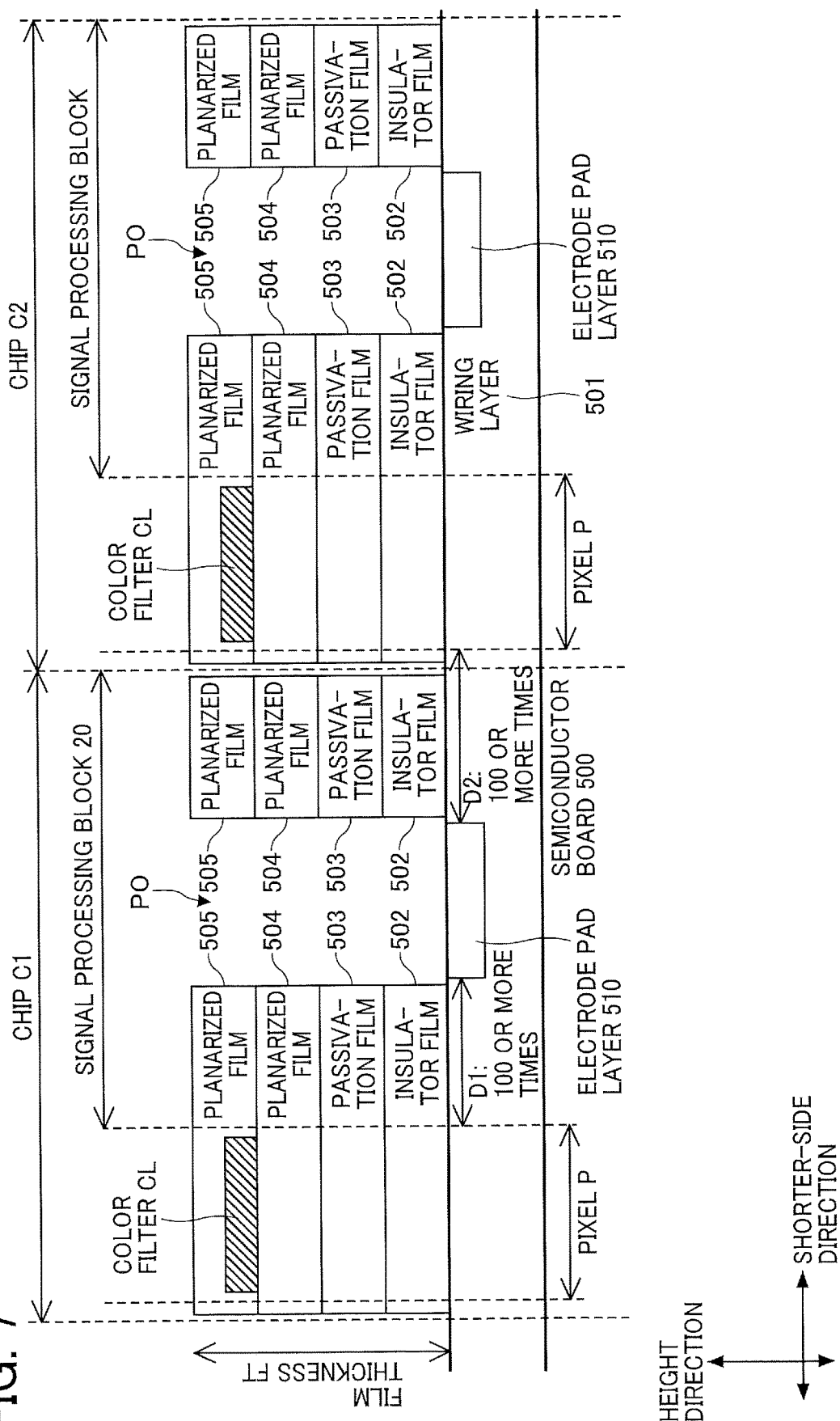
FIG. 7 is a cross-sectional view of the wafer in FIG. 6 in the longitudinal direction.

FIG. 7 is a cross-sectional view of the wafer W of chips C1 and C2 in each of which the electrode pads 40 are arranged in the signal processing block 20 according to an embodiment of the present disclosure.

In the present disclosure, an electrode pad layer 510 is disposed at a recessed area, whose level is lower than the level of the other areas, in the signal processing block 20. In the present embodiment as well, the film thickness FT refers to the height from the top surface of the electrode pad layer 510 to the top edge of the laminated films (the other areas) in the pixel block 10.

The electrode pad layer 510 of the signal processing block 20 is preferably separated from the color filter CL by a distance of 100 or more times the film thickness FT corresponding to the total thickness of an insulator film 502, a passivation film 503, and planarized films 504 and 505 including the color filter CL on the pixel in FIG. 7.

More preferably, the electrode pad layer 510 is separated from the end of a chip in the shorter-side direction (the longitudinal direction) by a distance of 100 or more times the film thickness FT in view of the case in which the pixels are arranged at the ends of the adjacent chip. Such measures prevent non-uniformity in the color filter.

Figure 8:
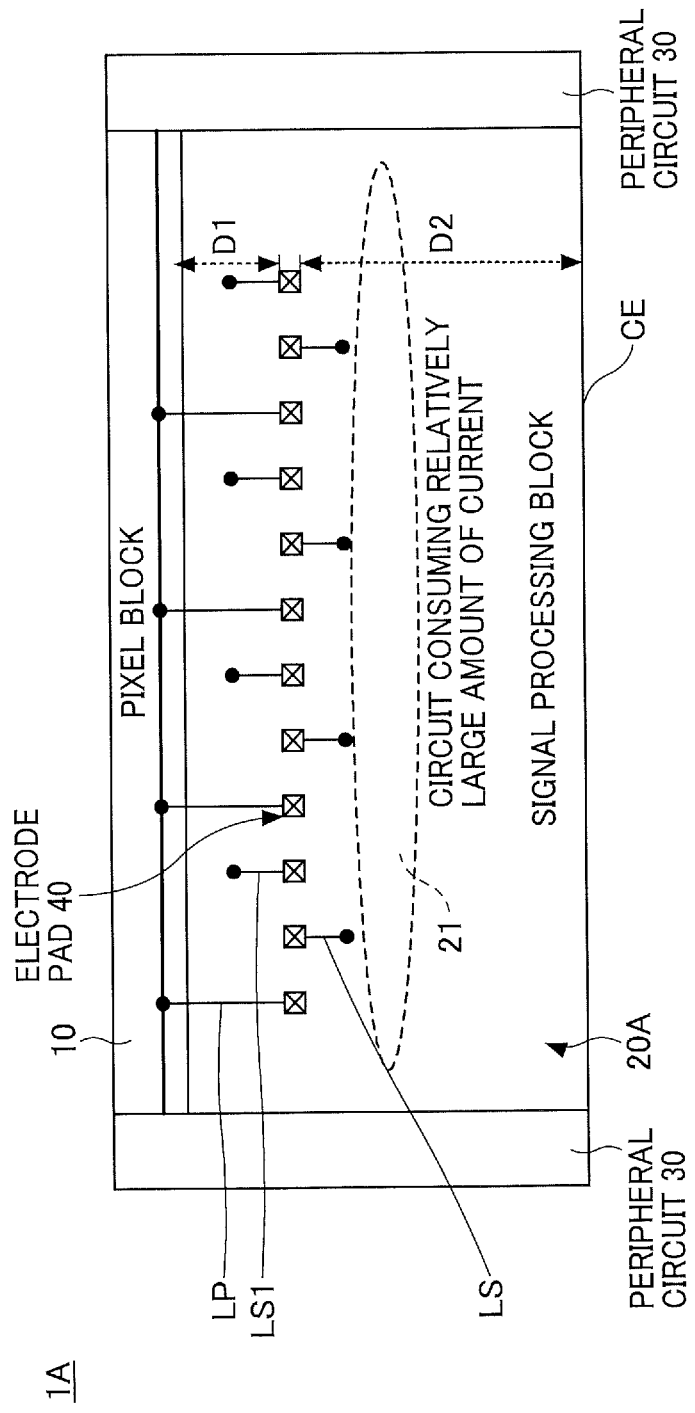
FIG. 8 is a diagram of electrode pads and electrode wiring in a photoelectric conversion chip according to a first embodiment.

FIG. 8 is a wiring diagram of a photoelectric conversion chip 1A provided with electrode pads 40, according to a first embodiment.

It is commonly known in the art that when the signal processing block includes a block whose consumption current is large, if the block is apart from the electrode pads and the wiring length is long, the width of the wiring lines are increased so as to reduce the resistance of the wiring lines in view of the IR drop. Such measures, however, adversely increase the layout area of the photoelectric conversion chip.

In the photoelectric conversion chip 1A according to an embodiment of the present disclosure, the electrode pads 40 are disposed within or near a circuit 21 that consumes a large amount of current in the signal processing block 20A so as to avoid such a situation. When disposed near the circuit 21 that consumes a large amount of current, the electrode pads 40 are preferably disposed closer to the pixel block 10 than the circuit 21 (at the upper side relative to the circuit 21 in FIG. 8), so as to prevent the wiring lines LP leading to the pixel block 10 from passing through the circuit 21.

In this case as well, each of the distance D1 and the distance D2 is preferably 100 or more times the film thickness FT. The distance D1 is between the electrode pads 40 and the pixel block 10, and the distance D2 is between the electrode pads 40 and the chip end CE (the lower end in FIG. 8) extending in the longer-side direction.

This configuration enables the electrode pads 40 to be disposed very close to the circuit 21 that consumes a large amount of current, which further enables a reduction in the wiring length of the wiring line LS1 and a reduction in the wiring width. Thus, layout space for wiring is reduced, and an increase in the area of the chip is prevented.

Figure 9:
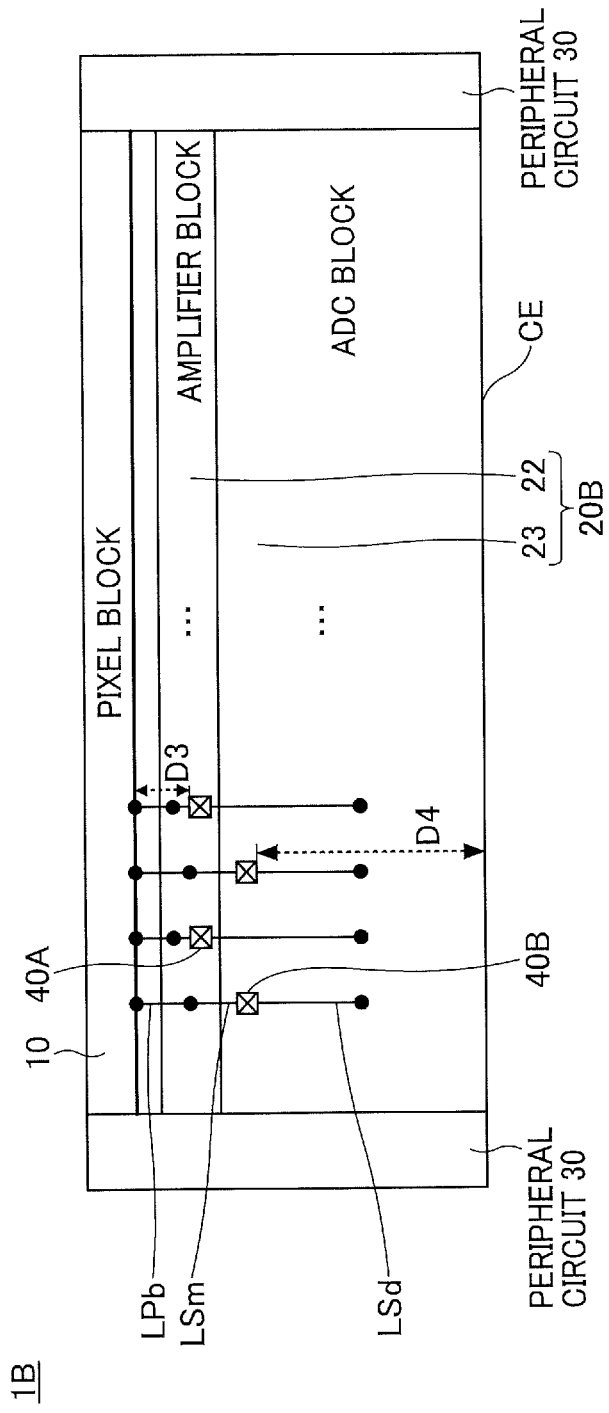
FIG. 9 is a diagram of the electrode wiring of a photoelectric conversion chip in which electrode pads are arranged in an analog digital converters (ADC) block and on the periphery of the ADC block, according to a second embodiment.

FIG. 9 is a wiring diagram of a photoelectric conversion chip 1B in which electrode pads 40B are arranged in an ADC block 23 and electrode pads 40A are arranged adjacent to the ADC block 23, according to a second embodiment.

In the present embodiment, the signal processing block 20B includes an amplifier block 22 and an ADC block 23. The amplifier block 22, for example, amplifies a plurality of signals output from the pixel block 10. The amplifier block 22 is disposed closer to the pixel block 10 than the ADC block 23 within the signal processing block 20B to facilitate the process flow of the signal processing block 20B.

The ADC block 23 converts alternating current into direct current. The ADC block 23, which consumes more amount of current than the other blocks, is more vulnerable to the IR drop than the other blocks. The ADC block 23 is an example of the circuit 21 that consumes large amount of current in FIG. 8.

The electrode pads are preferably as close to the ADC block 23 as possible to reduce the IR drop because the wiring width has to be increased according to the distance to the electrode pad.

In the photoelectric conversion chip 1B according to the present embodiment, electrode pads 40A are disposed adjacent to the ADC block 23 or electrode pads 40b are disposed within the ADC block 23 so as to reduce the IR drop. This arrangement prevents an increase in the area of the photoelectric conversion chip.

In this arrangement, the electrode pads 40A, which are arranged in the amplifier block 22 closer to the pixel block 10 than the ADC block 23 in the signal processing block 20B, are preferably separated from the pixel block 10 in the longitudinal direction by a distance D3 of 100 or more times the film thickness FT.

Further, the electrode pads 40B, which are arranged in the ADC block 23 closer to the chip end CE than the amplifier block 22 within the signal processing block 20B, are preferably separated from the chip end CE in the longitudinal direction by a distance D4 of 100 or more times the film thickness FT.

In the example of FIG. 9, the electrode pads 40A and 40B shared by all the blocks 10, 22, and 23 supply power to the pixel block 10, the amplifier block 22, and the ADC block 23 through the wiring lines LPb, LSm, and LSd. This is only one example, and in some other examples, each electrode pad is connected to any one of the blocks through a separate wiring line.

Figure 10:
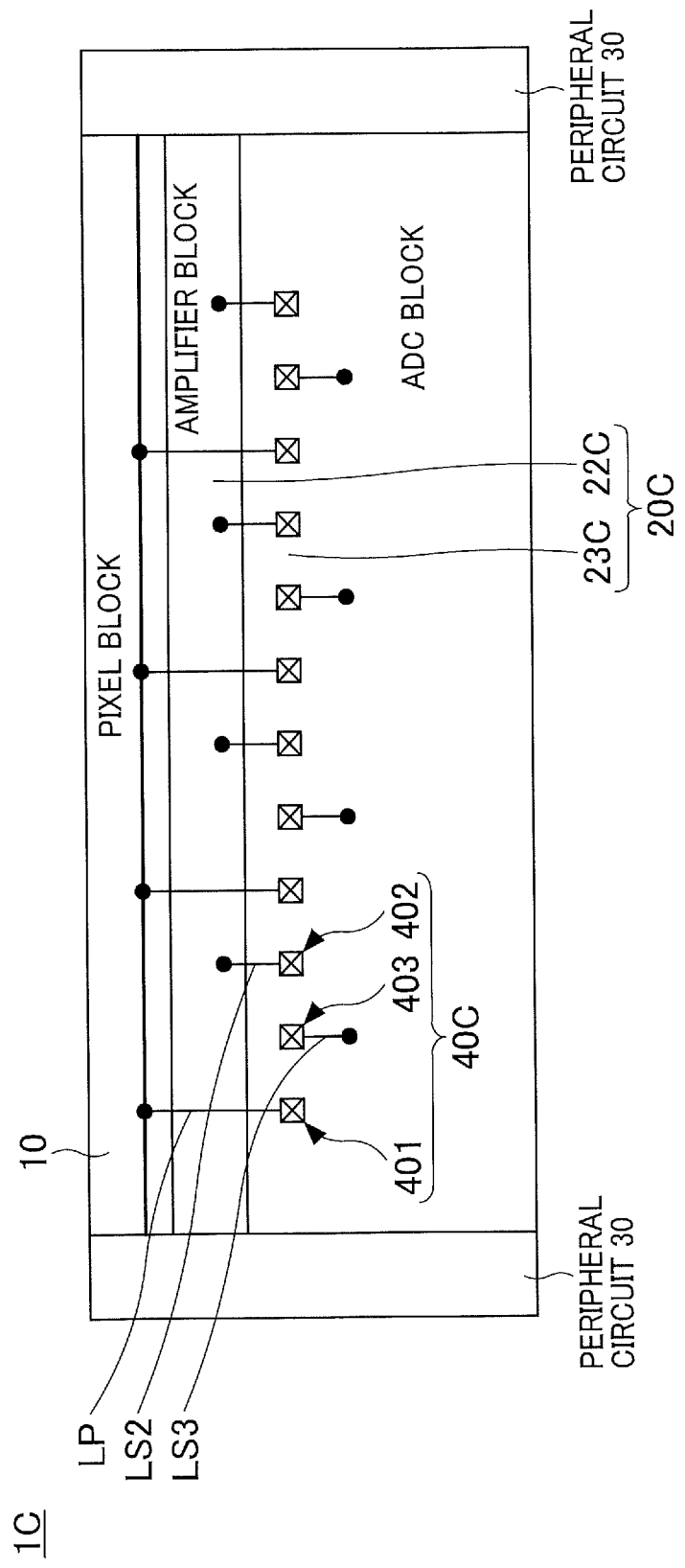
FIG. 10 is a wiring diagram of a photoelectric conversion chip in which each electrode pad is provided to separately supply power to any one of the blocks, according to a third embodiment of the present disclosure.

FIG. 10 is a wiring diagram of a photoelectric conversion chip 1C in which each electrode pad is provided to separately supply power to any one of the blocks 10, 22C, and 23C, according to a third embodiment of the present disclosure.

In photoelectric conversion chip 1C according to the present embodiment, electrode pads 40C (electrode pads 401, 402, and 403) in the signal processing block 20C are connected to the pixel block 10, an amplifier block 22C, and an ADC block 23C, respectively. In particular, since the ADC block 23C consumes a large amount of current and is more likely to generate noise, the dedicated electrode pads 401, 402, and 403 are provided to supply power to the pixel block 10, the amplifier block 22, and the ADC block 23C, respectively.

Such a circuit configuration prevents each electrode pad 403 for supplying power to the ADC block 23C and each electrode pad 401 for supplying power to the pixel block 10A, from being shared by the blocks, and also prevents the wiring line LS3 and the wiring line LP for supplying power to the pixel block 10 from being shared by the blocks (the wiring line LS3 and the wiring line LP are used separately). In other words, each electrode pad is provided to supply power to only one of the blocks, and each wiring line is also connected to only one of the blocks.

This circuit configuration according to the present embodiment enables the wiring line LP for supplying power to the pixel block 10 to be independent of the other wiring lines (LS2 and LS3) and prevents noise interference between the pixel block 10 and the signal processing block 20C, thus reducing noise of the photoelectric conversion chip 1C.

In the example of FIG. 10, all the electrode pads 401, 402, and 403 for supplying power to the respective blocks are arranged side by side in the lateral direction within the ADC block 23C. In some examples, the electrode pads 401 and 402 other than the electrode pad 403 for supplying power to the ADC block 23C may be disposed within the amplifier block 22C.

Figure 11:
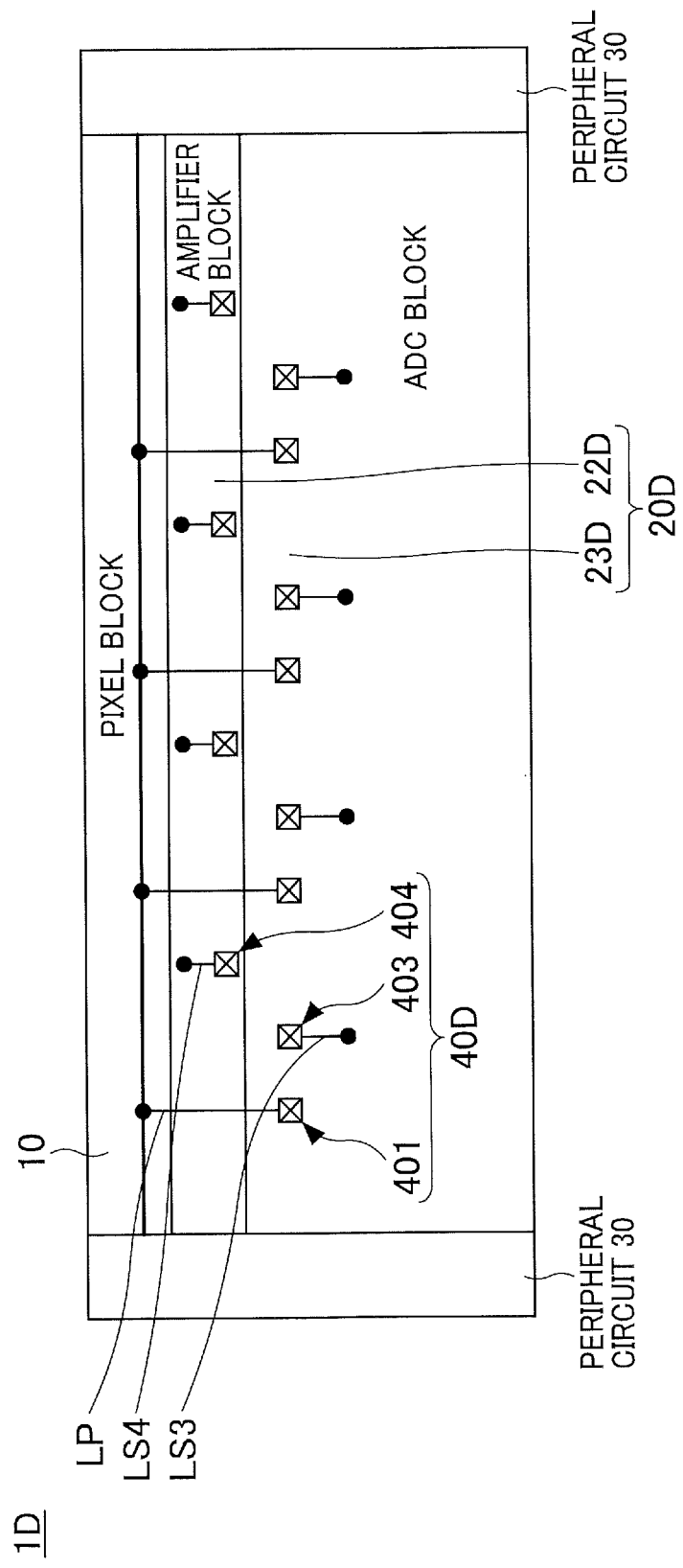
FIG. 11 is a wiring diagram of a photoelectric conversion chip in which electrode pads are disposed close to a circuit block, according to a fourth embodiment of the present disclosure.

FIG. 11 is a wiring diagram of a photoelectric conversion chip 1D in which electrode pads are disposed close to a circuit block (the amplifier block 22D), according to a fourth embodiment of the present disclosure.

In the signal processing block 20D according to the present embodiment, the electrode pads 40D are disposed close to the circuit block, and each electrode pad 40D is separately connected to any one of the pixel block 10, the amplifier block 22D, and the ADC block 23D. Specifically, the electrode pads 403 for supplying power to the ADC block 23D are disposed within the ADC block 23D as in FIG. 10, and the electrode pads 404 for supplying power to the amplifier block 22D are disposed within the amplifier block 22D.

The electrode pads, which are disposed within the amplifier block, generate noise to a degree that does not affect amplification. The pixel block is preferably fed with power having less noise component, and when each electrode pad is independently connected to any one of the blocks, the electrode pads 401, which are disposed in the ADC block 23D, are used to supply power to the pixel block 10 because the ADC block 23D is apart from the pixel block 10 and such electrode pads 401 generate less noise.

This configuration in which each of the electrode pads 40D (the electrode pads 401, 403, and 404) is separately connected to any one of the blocks, enables the wiring line LP to be independent of the other wiring lines. Thus, noise interference in the pixel block 10 is reduced or eliminated. In this configuration, the electrode pads 404 and 403 are disposed in the blocks 22D and 23D, respectively within the signal processing block 20D. This arrangement enables a reduction in the wiring length of the wiring lines LS4 and LS3, and reduces the resistances of the wiring lines LS4 and LS3, thus improving the properties and characteristics of the wiring lines.

Figure 12:
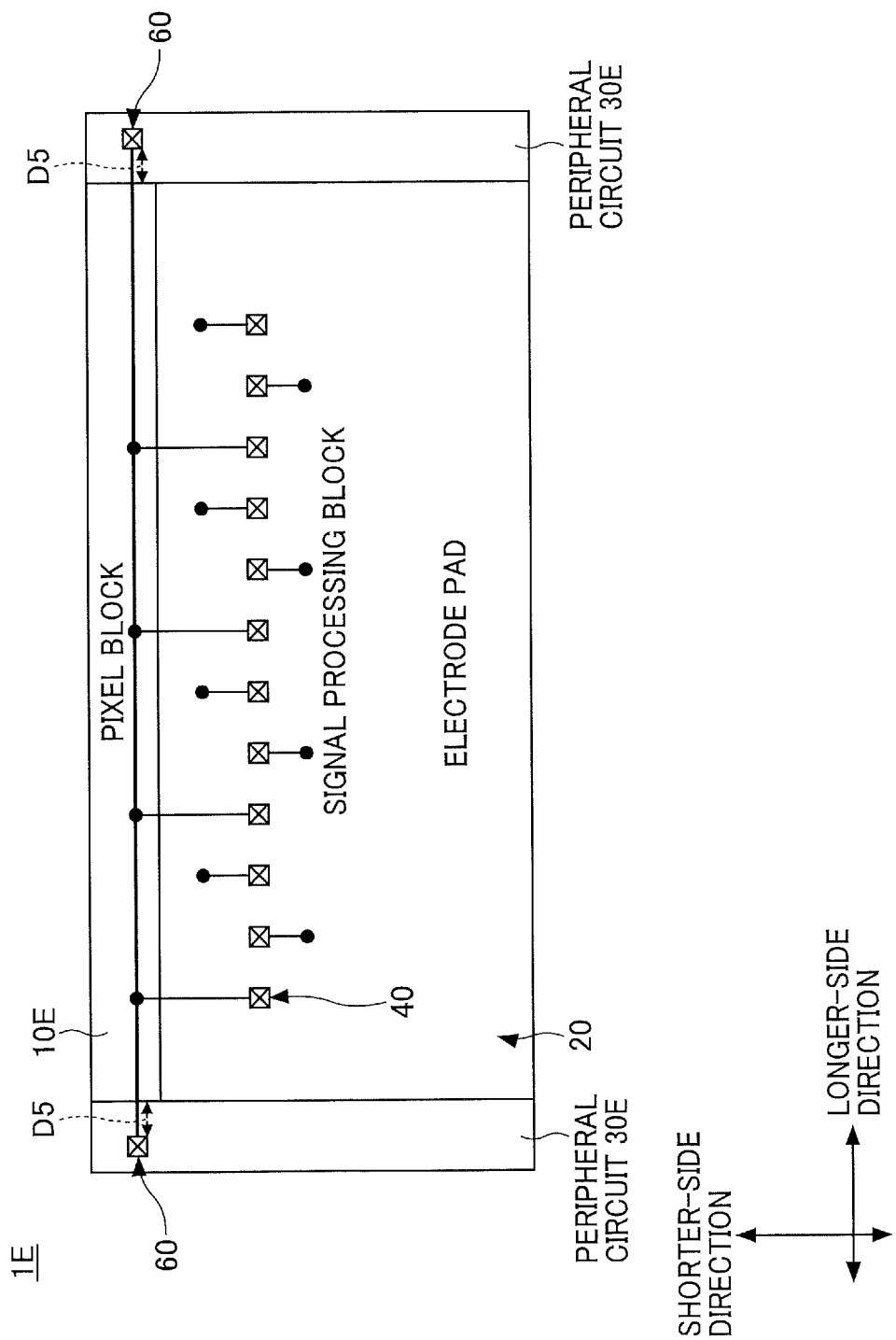
FIG. 12 is a wiring diagram of a photoelectric conversion chip in which an electrode pad is arranged also in a peripheral circuit, according to a fifth embodiment of the present disclosure.

FIG. 12 is a wiring diagram of a photoelectric conversion chip 1E in which electrode pads are arranged also in a peripheral circuit in addition to the signal processing block 20, according to a fifth embodiment of the present disclosure.

In the photoelectric conversion chip 1E according to the present embodiment, in addition to the electrode pads 40 in the signal processing block 20, electrode pads 60 in peripheral circuits 30E are used to supply power to the pixel block 10E.

Each peripheral circuit 30E is, for example, a logic circuit and is disposed at each side of the photoelectric conversion chip 1E in the longer-side direction (the right-to left direction in FIG. 12). This configuration that supplies power to the pixel block 10E by using the electrode pads 60 in peripheral circuits 30E in addition to the electrode pads 40 in the signal processing block 20 reinforces the power supply the pixel block 10E, that is, the photoelectric conversion block.

Figure 13:
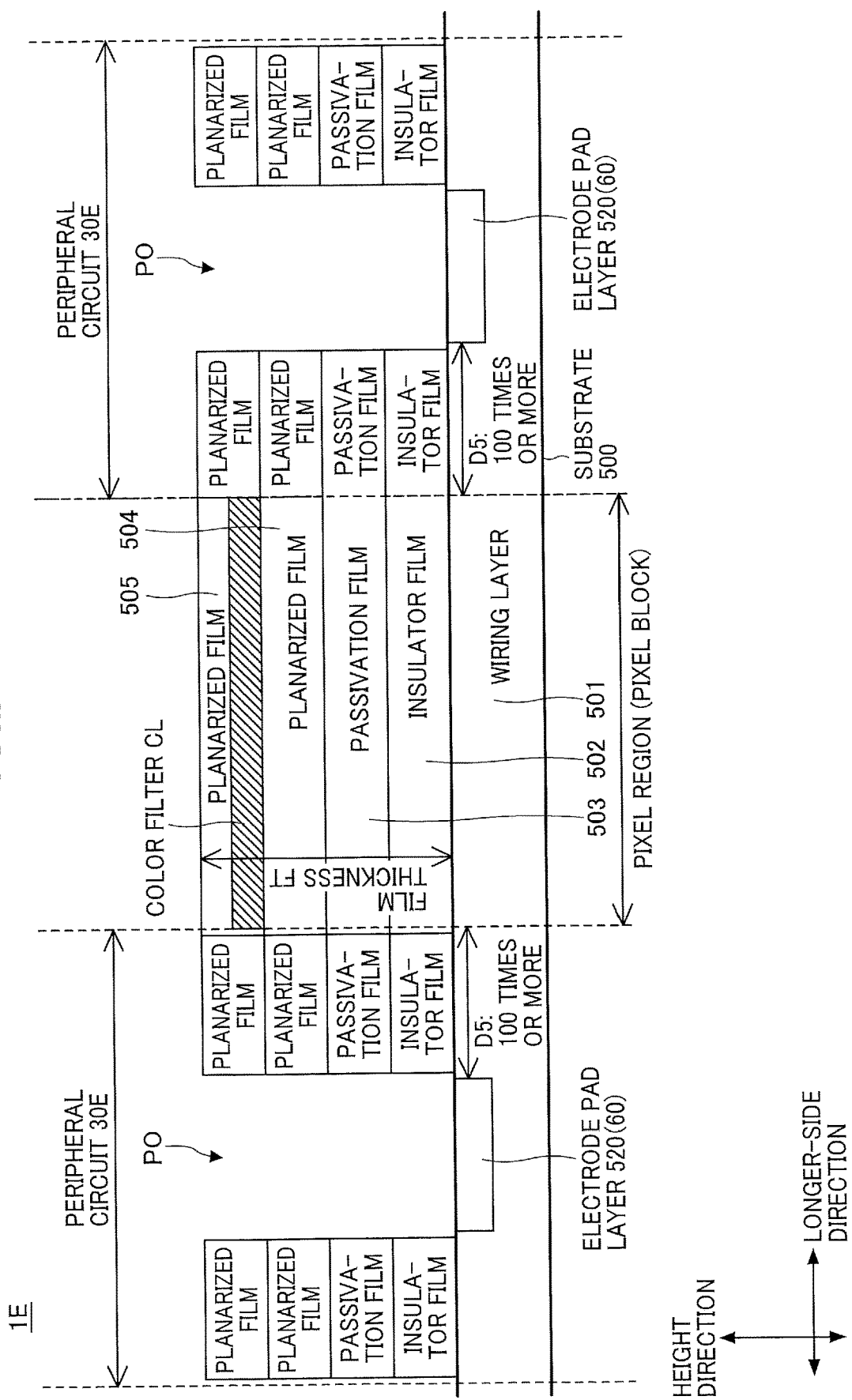
FIG. 13 is a cross-sectional view of a wafer in the lateral direction on which the photoelectric conversion chip in FIG. 12 is mounted, according to an embodiment of the present disclosure.

FIG. 13 is a cross-sectional view of a wafer in the lateral direction (longer-side direction) on which the photoelectric conversion chip 1E in FIG. 12 is mounted, according to an embodiment.

In the peripheral circuit 30E, a passivation film 503 and an insulator film 502 are formed on a wiring layer 501, and these films are then partly removed to form an electrode pad layer 520, thus foaming a pad opening PO above the electrode pad layer 520. In other words, the electrode pad layer 520 is disposed in a recessed area whose level is lower than the level of the other area, which means that there is a difference in level between the electrode pad layer 520 and the other area. Further, planarized films 504 and 505 made of, for example, resin material are applied onto the passivation film 503 through spin coating so that a color filter and an on-chip microlens are disposed on the planarized films 504 and 505. Thus, the pad opening PO provides a difference in level between the recessed area (the electrode pad layer 520) and the laminated layers, i.e., the other area.

The electrode pad 60 is separated from the edge of the pixel block 10E in the longer-side direction by a distance D5 of 100 or more times the film thickness FT above the pixels, in each peripheral circuit 30E to deal with the recessed area. Separating the electrode pad 60 from the edge of the pixel block 10 by a distance of 100 or more times the film thickness FT effectively reduces non-uniformity of the color filter CL.

Figure 14:
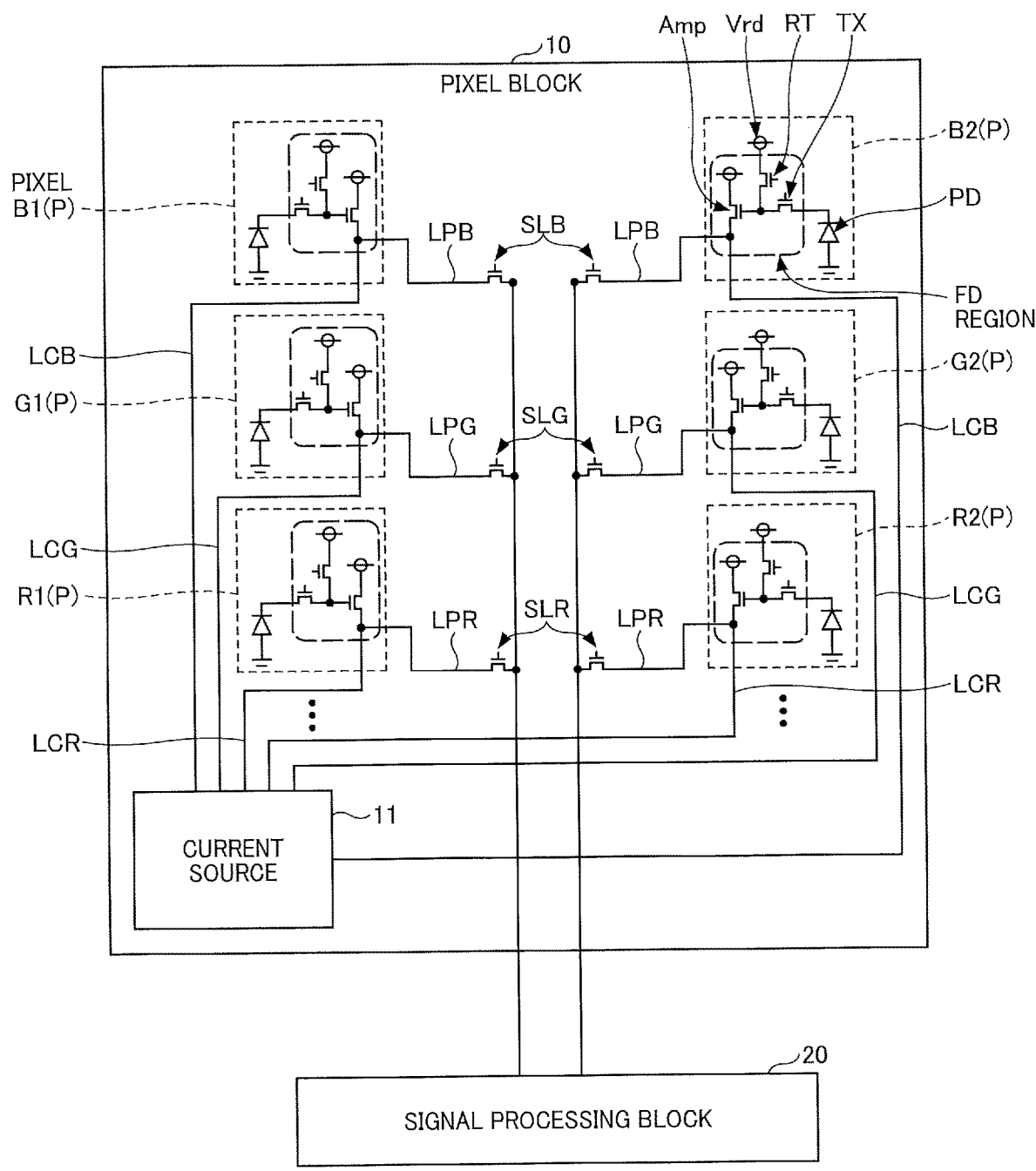
FIG. 14 is a circuit diagram of a pixel block mounted on a photoelectric conversion chip according to a comparative example.

FIG. 14 is a typical circuit diagram of the pixel block 10. In the example of FIG. 14, six pixels P are arranged in the pixel block 10.

Each pixel P in the pixel block 10 is a photoelectric converter that photoelectrically converts light into an electric signal in response to incident light. Each pixel P (pixel unit) in the pixel block 10 includes a reset switch (reset transistor) RT, a transfer switch (transfer transistor) TX, a photosensor (photoelectric conversion element) PD, and an amplifier (amplifier transistor) Amp.

The anode of the photosensor PD is connected to the ground voltage, and the cathode of the photosensor PD is connected to one end of the transfer switch TX. The other end of the transfer switch TX is connected to one end of the amplifier transistor Amp and the reset switch RT.

An area in which the transfer switch TX, the amplifier transistor Amp, and the reset switch RT are connected to each other is referred to as a float diffusion region FD. The float diffusion region FD serves as a read circuit that reads electric charges and transfers the electric charges to junction stray capacitance within the pixel P to convert the electric charges into voltage (charge-voltage conversion).

A drive signal (reset drain voltage) Vrd, which is a reset voltage, is applied to the other end of the reset switch RT.

A color filter CL (see FIG. 7) and a microlens are formed on or above the photosensor PD. In some examples, a microlens may not be formed on or above the photosensor PD.

The reset switch RT, the transfer switch TX, the photosensor PD, the amplifier Amp, the color filter CL, and a microlens if mounted, are collectively referred to as a pixel P.

The six pixels P include pixels B1 and B2 in each of which a blue (B) color filter that transmits blue light is mounted above the photosensor PD, pixels G1 and G2 in each of which a green (G) color filter that transmits green light is mounted above the photosensor PD, and pixels R1 and R2 in each of which a red (R) color filter that transmits red light is mounted above the photosensor PD.

Further, two selecting switches SLR are connected to the pixels R1 and R2, two selecting switches SLG are connected to the pixels G1 and G2, and two selecting switches SLB are connected to the pixels B1 and B2, respectively. The two selecting switches for the same color are simultaneously driven.

The pixel block 10 further includes a current generator 11 to drive the amplifier Amp of each pixel, and wiring lines LCB, LCG, LCR are provided to connect between the current generator 11 and a float diffusion region FD including a corresponding amplifier Amp. In this circuit configuration, two wiring lines LCB and LCG connecting to the current generator 11 are arranged beside each of the pixels R1 and R2.

Figure 15:
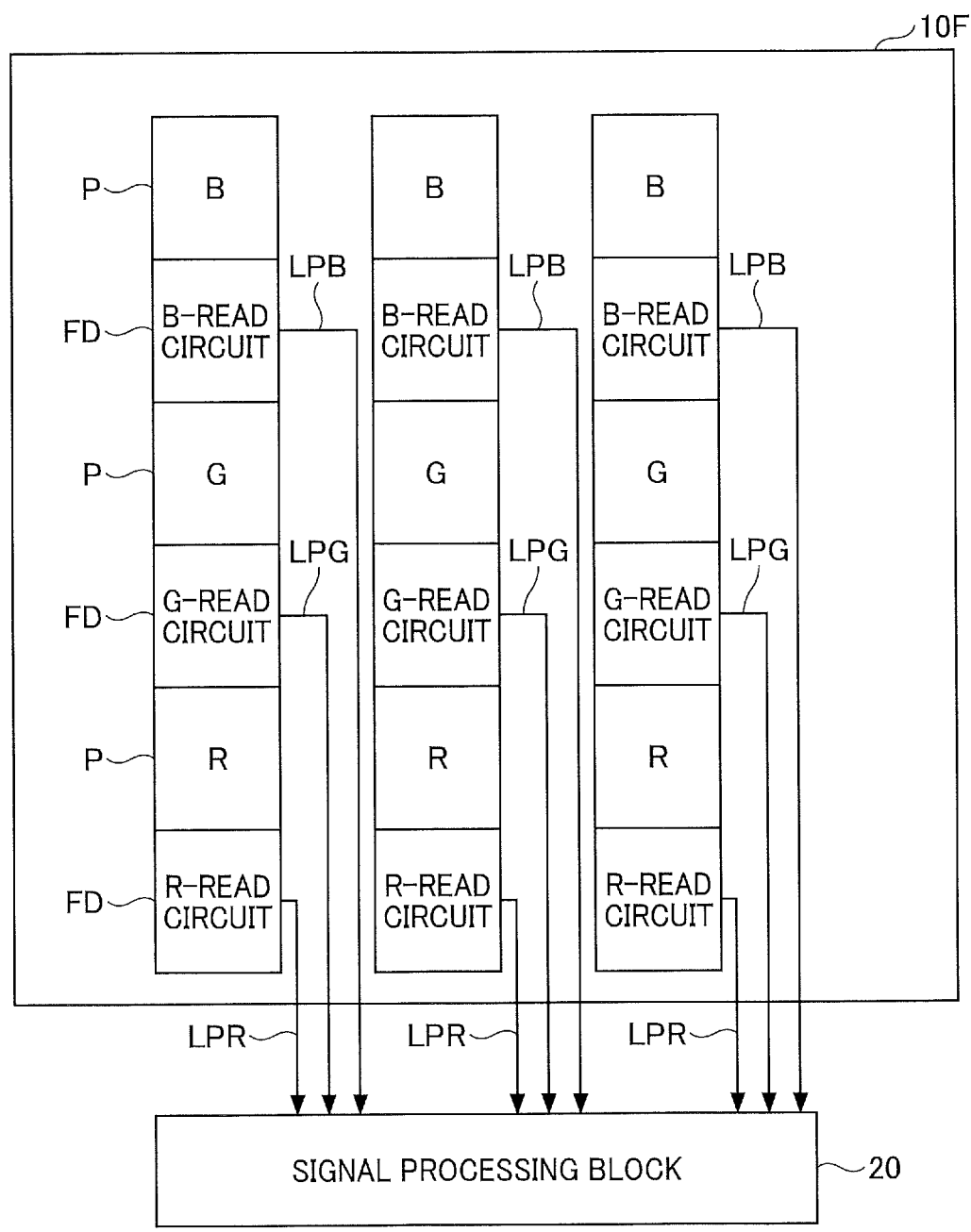
FIG. 15 is a wiring diagram in which electrode wiring is provided to supply power from a signal processing block below a pixel block to the pixel block, according to a comparative example.

FIG. 15 is a wiring diagram in which electrode wiring is provided to supply power from a signal processing block 20 below a pixel block 10F to the pixel block 10F, according to another comparative example. The readout circuits for each color in FIG. 15 correspond to the float diffusion regions FD in FIG. 14.

In the pixel block (photoelectric conversion block) 10F of the wiring configuration according to the present embodiment, the wiring lines LPB, LPG, and LPR are drawn from the right of the read circuits (floating diffusion areas FD) of the pixels for the blue, the green, and the red, respectively to the signal processing block 20 below the pixel block 10F.

In this wiring configuration, two wiring lines (output lines, signal lines) at maximum are arranged beside the pixel. In the example of FIG. 15, two wiring lines LPB and LPG are arranged beside the pixel P for the red at the lower side of the pixel block 10F.

Figure 16:
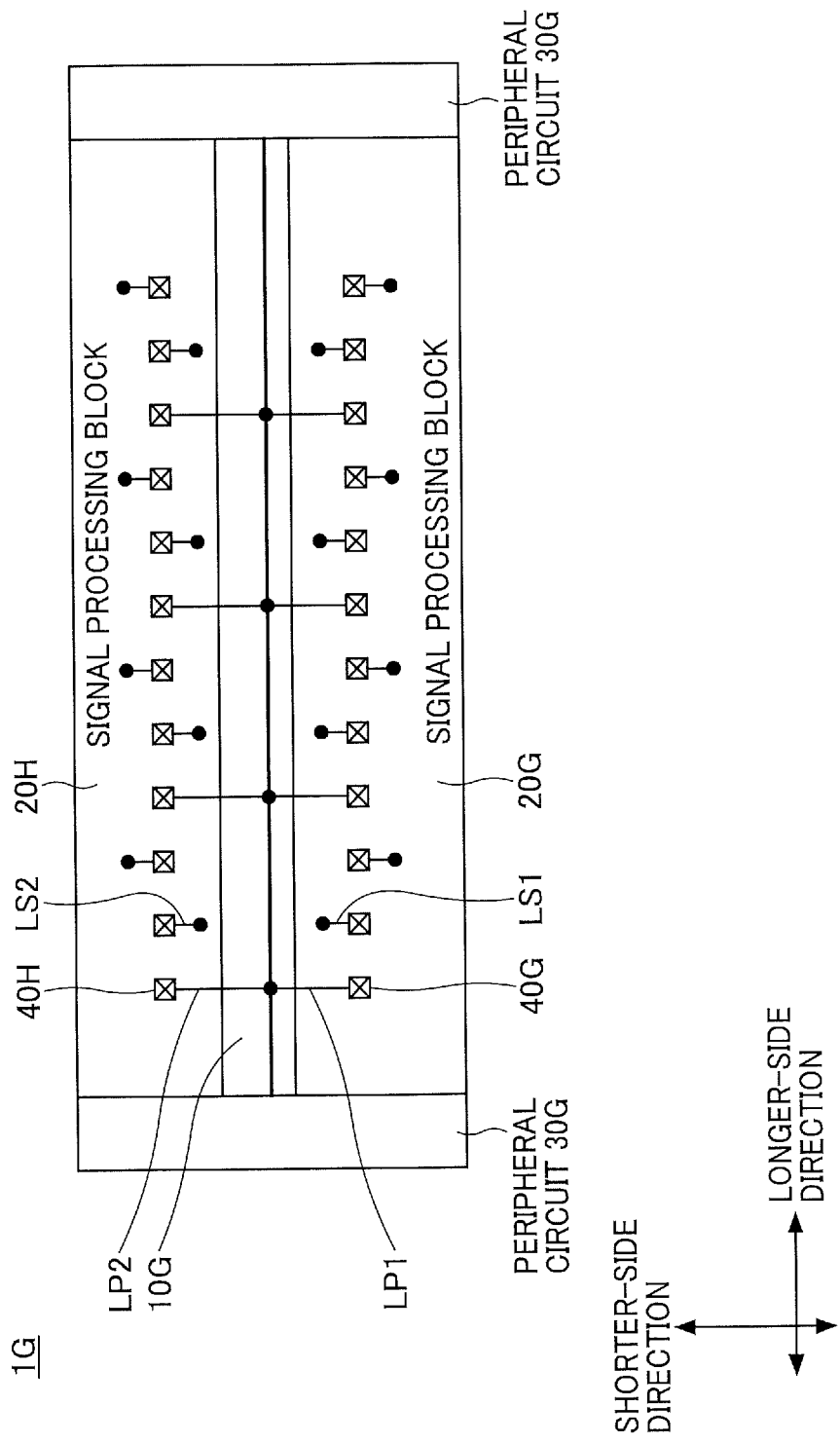
FIG. 16 is a schematic diagram of a photoelectric conversion chip according to a sixth embodiment in which a pixel block is disposed between signal processing blocks.

FIG. 16 is a schematic diagram of a photoelectric conversion chip 1G in which a pixel block 10G is disposed between a signal processing block 20H and a signal processing block 20G, according to a sixth embodiment of the present disclosure.

In the photoelectric conversion chip 1G according to the present embodiment, the pixel block 10G (photoelectric conversion block) is disposed between two signal processing blocks 20G and 20H in the shorter-side direction of the photoelectric conversion chip 1G. In other words, a signal processing block 20G is disposed at the upper side of the pixel block 10G, and a signal processing block 20H is disposed at the lower side of the pixel block 10G.

In this arrangement, electrode pads 40G and 40H are arranged in the signal processing blocks 20G and 20H, respectively, and the wiring lines are drawn from the electrode pads 40G and 40H to the pixel block 10G, the signal processing blocks 20G and 20H, respectively.

As in the above-described embodiment, this arrangement also achieves a reduction in the resistance of the wiring lines for supplying power to the pixel block because the electrode pads 40H and 40G are closer to the pixel block 10G than the case in which the electrode pads are disposed at the ends of the photoelectric conversion chip 1G, and also because the wiring lines are connected from the electrode pads at the upper and lower sides of the pixel block 10G. Further, in this arrangement, the electrode pads 40G and 40H are arranged in the signal processing blocks 20G and 20H, respectively, which means that the electrode pads are close to the circuit, thus achieving a reduction in the resistance of the wiring lines. This arrangement further achieves a reduction in the layout area without a need for additional layout space and prevents an increase in the area of the photoelectric conversion chip 1G.

The electrode pads 40G and 40H arranged in the signal processing block 20G and 20H, respectively, are preferably arranged symmetrically about the pixel block 10G extending in the longer-side direction of the photoelectric conversion chip 1G. In other words, the signal processing blocks 20G and 20H, which are arranged in the upper and lower side of the pixel block 10, are preferably the same circuit, and the electrode pads 40G and 40H are preferably arranged substantially symmetrically in the longitudinal direction (the shorter-side direction). Further, the wiring lines LP1 and LS1 from the electrode pads 40G and the wiring lines LP2 and LS2 from the electrode pads 40H are also symmetrical about the pixel block 10G in the longitudinal direction. This configuration provides the same properties and characteristics at the upper and lower side of the photoelectric conversion chip 1G.

Figure 17:
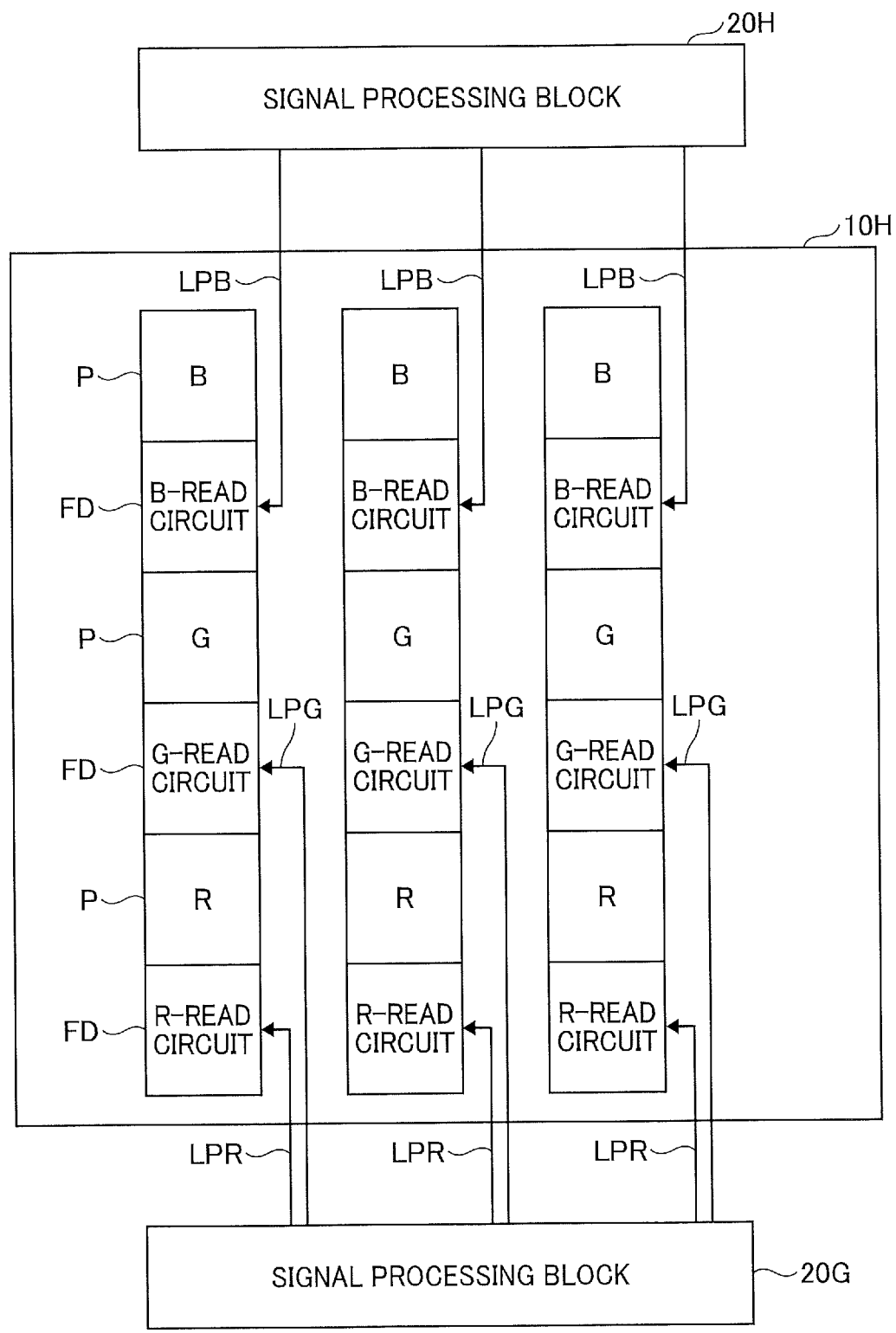
FIG. 17 is a wiring diagram of the photoelectric conversion chip in FIG. 16 for describing electrode wiring for supplying power from the signal blocks to the pixel block, according to an embodiment of the present disclosure.

FIG. 17 is a wiring diagram of the photoelectric conversion chip 1G in FIG. 16 for describing electrode wiring for supplying power from the signal processing blocks 20G and 20H to the pixel block 10G between the signal processing blocks 20G and 20H, according to an embodiment of the present disclosure.

In the example of FIG. 17, wiring lines LPG and LPR are provided to supply power from the signal processing block 20G at the lower side to the read circuits (floating diffusion areas FD) in the pixels P for the green and the pixels P for the red, and wiring lines LPB are provided to supply power from the signal processing block 20H at the upper side to the pixels P for the blue.

In the comparative example of FIG. 15 described above, a maximum of two wiring lines LPB and LPG are arranged beside the pixels P for the red. In the present embodiment, however, a single wiring line LPG alone at most is arranged beside the pixels P for the red, which enables the pixels to capture more light.

In the configuration according to the present embodiment, the signal processing blocks are disposed at the upper and lower side of the pixel block to read the pixels. This configuration advantageously reduces the number of output lines (wiring lines) arranged at the right or left of the pixels, and thus enables the pixels to capture more light, resulting in an increase in the sensitivity of the pixels.

In the example of FIG. 17, power is supplied from the lower signal processing block 20G to the read circuits of the pixels P for the two colors, red and green, and power is supply from the upper signal processing block 20H to the read circuits of the pixels P for the blue. Alternatively, the electrode wiring may be configured such that power is supplied from the upper signal processing block 20H to the read circuits of the pixels P for the blue and the green, and power is supplied from the lower signal processing block 20G to the read circuits of the pixels P for the red.

In any one of the above-described embodiments, the electrode pads are arranged in the signal processing block, and undesired wiring lines are eliminated from the signal processing block so that an increase in the area of the photoelectric conversion chip is reduced or prevented.

Figure 18:
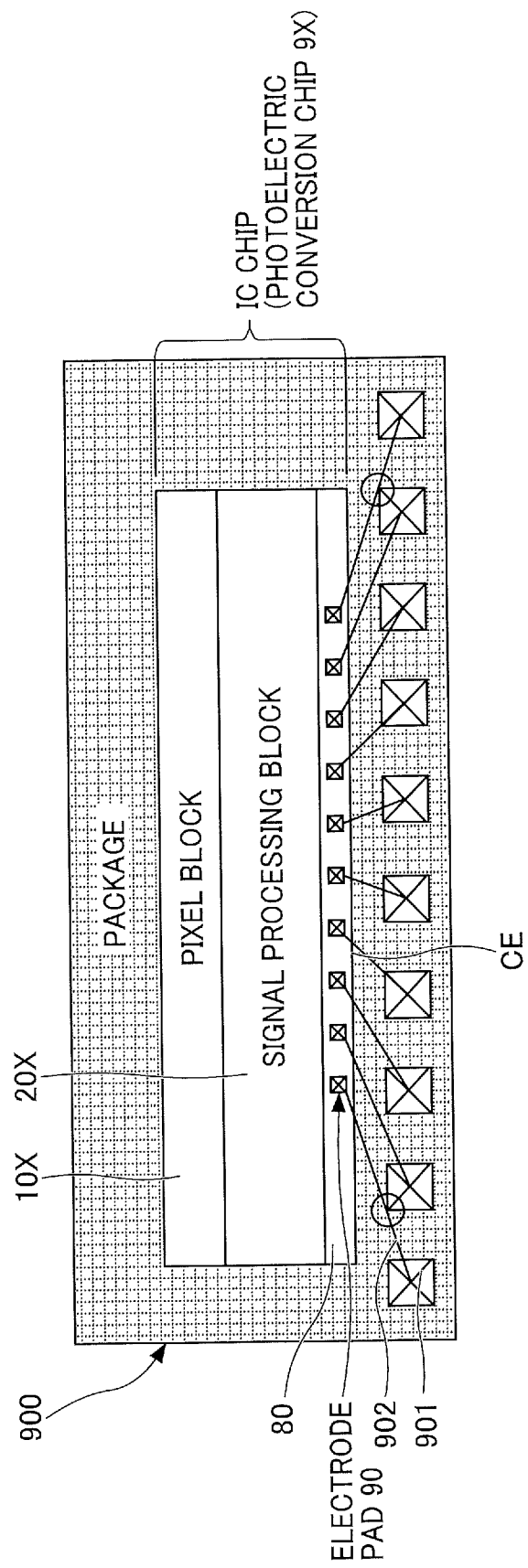
FIG. 18 is an illustration for describing bonding of a photoelectric conversion chip provided with electrode pads arranged close to the chip end and a package incorporating the photoelectric conversion chip, according to a comparative example.

FIG. 18 is an illustration for describing bonding of a photoelectric conversion chip 9X provided with electrode pads 90 arranged close to the chip end and a package incorporating the photoelectric conversion chip 9X, according to a comparative example.

In a typical package for integrated circuit (IC) chips, bonding pads on the IC chip and internal electrodes of the package are connected by a wire such as copper (Cu). A photoelectric conversion chip 9X in FIG. 18 is an example of an IC chip, and an electrode pad 90 is an example of a bonding pad.

In the package 900 incorporating the photoelectric conversion chip 9X of FIG. 18, the electrode pads 90 are arranged close to the chip end CE of the photoelectric conversion chip 9X in the longitudinal direction of the photoelectric conversion chip 9X, and the distance from the electrode pads 90 to the internal electrode pads 901 in the package 900 in the shorter-side direction (the longitudinal direction) is short. Further, the internal electrode pads 901 are arranged from one end to the other end of the package 900 in the longer-side direction (the lateral direction) of the package 900, and the electrode pads 90 arranged in the longer-side direction (the lateral direction) are substantially centered in the photoelectric conversion chip 9X in the longer-side direction of the photoelectric conversion chip 9X. In this arrangement, the angle of inclination of a wire 902 connecting one of the electrode pads 90 and a corresponding one of the internal electrode pads 901 becomes more acute as the electrode pad 90, which is connected by the wire 902 to a corresponding internal electrode pad 901, is closer to either one end of the photoelectric conversion chip 9X in the longer-side direction.

This arrangement might cause the wire 902 connecting the electrode pad 90 at either one end of the photoelectric conversion chip 90X in the longitudinal direction and the corresponding internal electrode pad 901 to contact another internal electrode pad 901 adjacent to the corresponding internal electrode pad 90, as indicated by circle in FIG. 18, which means that the wire 902 is useless.

The configuration according to the comparative example in FIG. 18, in which the electrode pads 90 are arranged close to the chip end of the IC chip, causes difficulties in wiring, resulting in that fewer electrode pads 90 are arranged in the photoelectric conversion chip 9X.

Figure 19:
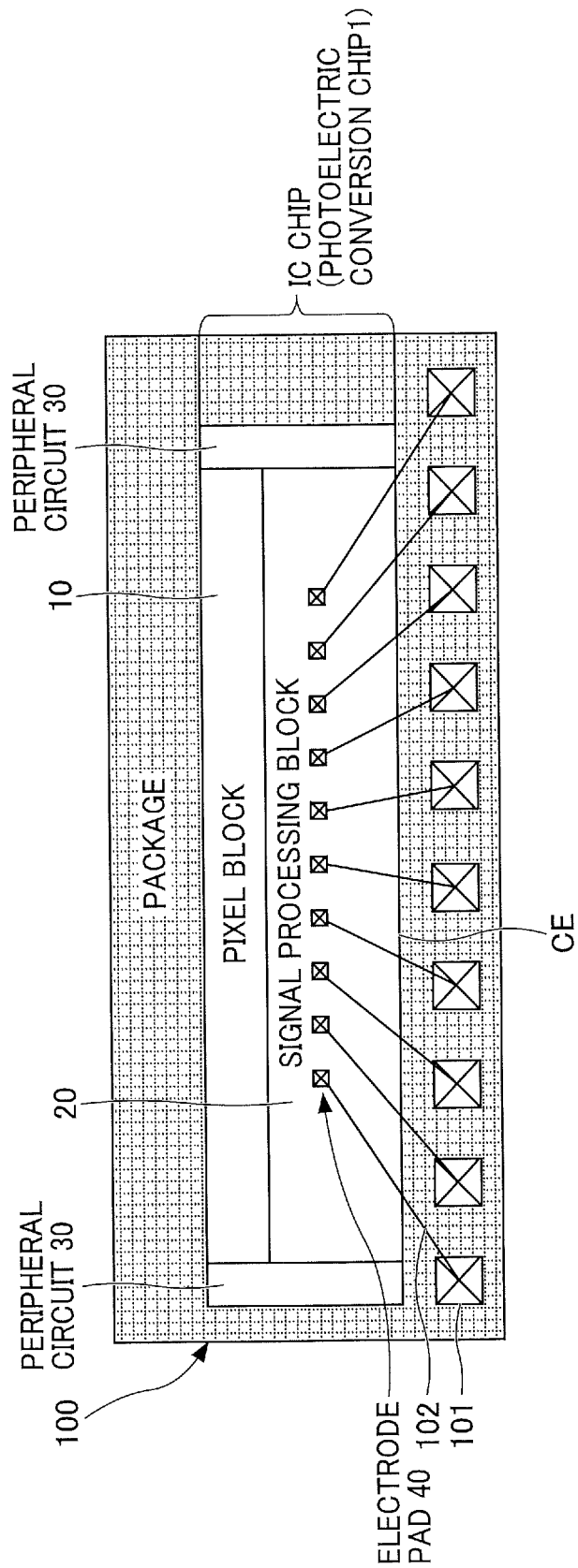
FIG. 19 is an illustration for describing bonding of a chip provided with electrode pads arranged in the signal processing block and a package incorporating the chip, according to an embodiment of the present disclosure.

FIG. 19 is an illustration of a chip in which electrode pads are arranged in the signal processing block, according to an embodiment of the present disclosure.

In the present embodiment, the electrode pads 40 are arranged near the circuit 21 (see FIG. 8) that consumes large amount of current, such as the ADC block 23, within the signal processing block 20, and the electrode pads 40 are apart from the chip end CE.

In other words, in the example of FIG. 19, the electrode pads 40 are apart from the chip end CE, and the distance from the electrode pads 40 to internal electrode pads 101 in a package 100 in the shorter-side direction of the IC chip is long. Further, the internal electrode pads 101 are arranged from one end to the other end of the package 100 in the longer-side direction of the package 100, and the electrode pads 40, which are arranged in the longer-side direction, are substantially centered in the signal processing block 20, that is, in an area except for the peripheral circuits 30 within the photoelectric conversion chip 1, in the longer-side direction of the photoelectric conversion chip 1. This configuration provides a larger angle of inclination of a wire 102 connecting one of the electrode pads 40 and a corresponding one of the internal electrode pads 101 than the angle of inclination of the wire 902 in the example of FIG. 18, even if the angle of inclination of the wire 102 decreases as the electrode pad 40, which is connected by the wire 102 to the corresponding internal electrode pad 101, is closer to either one side of the photoelectric conversion chip 1 in the longer-side direction.

Thus, this configuration prevents the wire 102, which connects one of the electrode pads 40 and a corresponding one of the internal electrode pads 101, from contacting another internal electrode pad 101 adjacent to the corresponding internal electrode pad 101, and facilitates wiring, thus enabling more electrode pads to be incorporated in the photoelectric conversion chip 1.

In the above-described embodiment, a photoelectric conversion chip and a package incorporating the photoelectric conversion chip are described. The photoelectric conversion chip and the package incorporating the photoelectric conversion chip are available as an image capturing device mounted on another apparatus.

Figure 20:
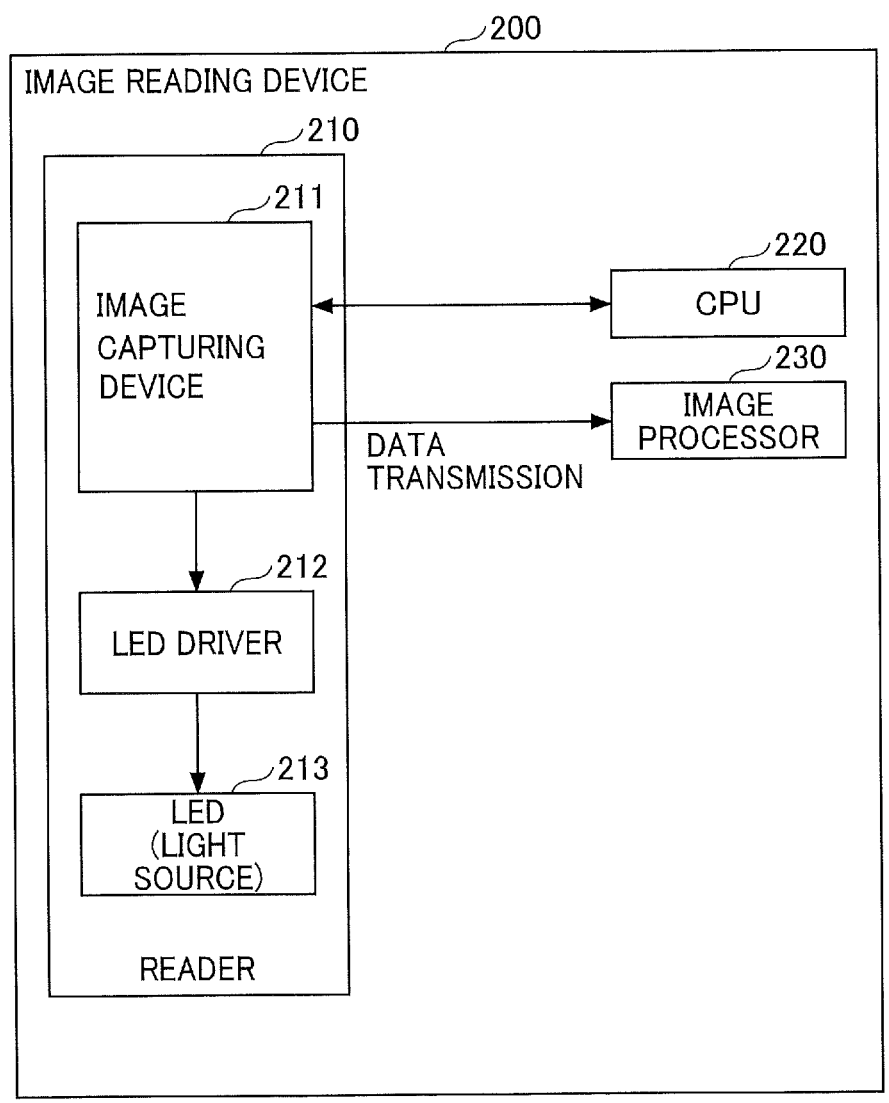
FIG. 20 is a block diagram of an image reading device incorporating a photoelectric conversion chip according to an embodiment of the present disclosure.

FIG. 20 is a block diagram of an image reading device 200 incorporating a photoelectric conversion chip according to an embodiment of the present disclosure.

The image reading device 200 includes a reader 210, a central processing unit (CPU) 220, and an image processor 230. The reader 210 includes an image capturing device 211 incorporating a photoelectric conversion chip according to an embodiment of the present disclosure, a light emitting diode (LED) driver 212, and an LED 213.

In the reader 210, the LED driver 212 drives the LED 213 as a light source to emit light to a document, and the image capturing device 211 performs photoelectric conversion on the light reflected from the document to generate analog-digital (AD) converted data and transfers the AD converted data to the image processor 230 subsequent to the image capturing device 211.

The CPU 220 controls the entire operation of the image reading device 200. The image processor 230 makes various corrections on image data (AD converted data) transferred from the image capturing device 211.

The image capturing device 211 incorporating the photoelectric conversion chip according to an embodiment of the present disclosure achieves a reduction in noise while reducing the layout area, which further minimizes color unevenness in read images and achieves downsizing of the image reading device itself. Alternatively, such an image capturing device 211 incorporating the photoelectric conversion chip according to an embodiment of the present disclosure achieves a reduction in layout space within the chip and provides space for disposing a device having another function.

Examples of the image reading device 200 include an area sensor in which pixels are arranged in a plane and a linear sensor in which pixels are linearly arranged. A typical area sensor has a fixed number of pixels for sub-scanning, whereas a linear sensor may have any desired number of pixels (lines). In the case of a linear sensor, however, a difference in characteristics that occurs between pixels is adversely reflected in the sub-scanning direction as a whole and cannot be compensated for by pixels in other columns. In other words, the difference in characteristics between the pixels that occurs in the linear sensors is more likely to be conspicuous.

In the configuration according to an embodiment of the present disclosure, all the electrode pads are separated from the pixel block by 100 or more times the film thickness of the laminated layers on the pixels so as to prevent the occurrence of non-uniformity in the color filter. The photoelectric conversion device having this configuration is effective in the linear sensors.

Figure 21:
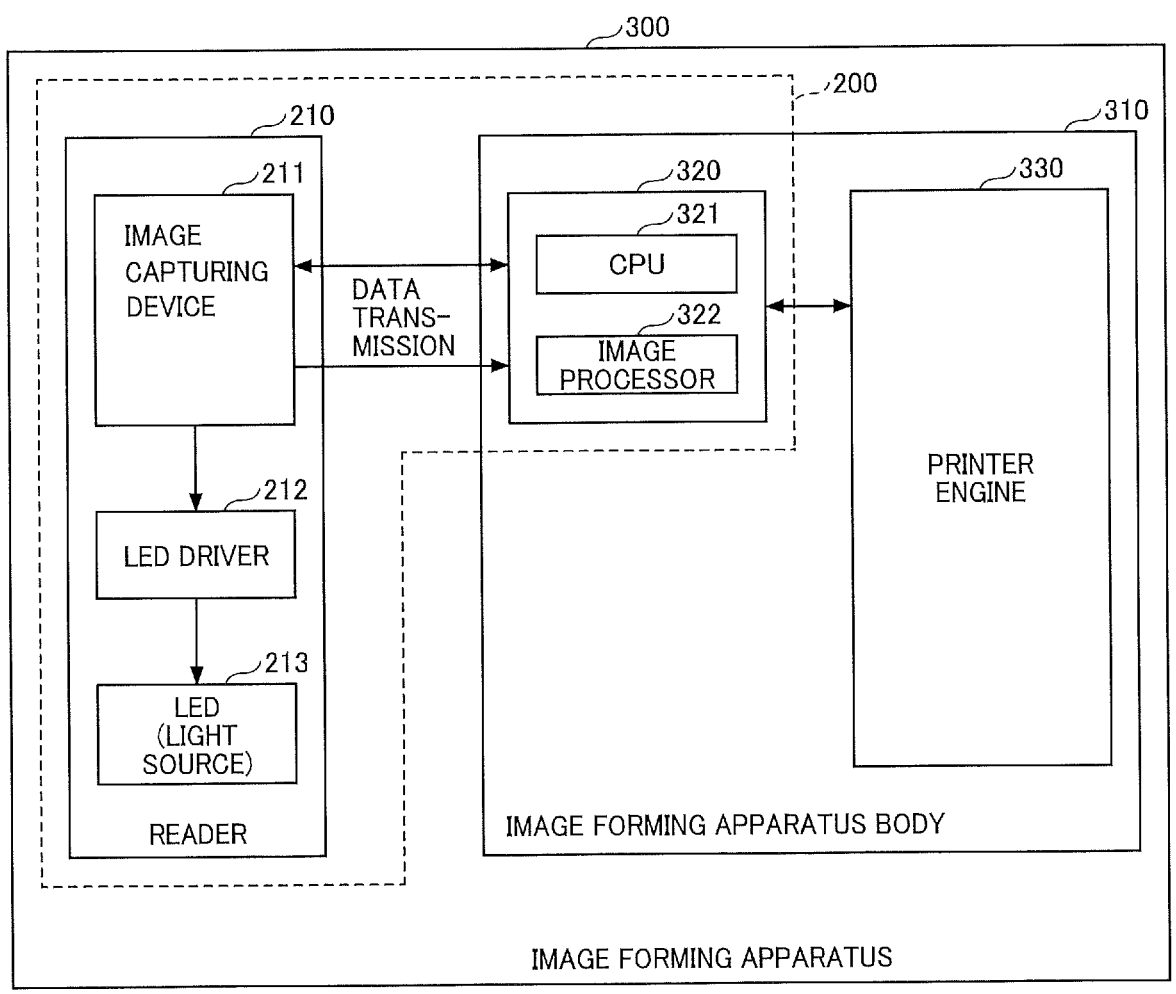
FIG. 21 is a block diagram of an image forming apparatus incorporating an image reading device provided with a photoelectric conversion chip according to an embodiment of the present disclosure.

FIG. 21 is a block diagram of an image forming apparatus 300 incorporating the image reading device 200 provided with a photoelectric conversion chip according to an embodiment of the present disclosure.

The image forming apparatus 300 includes a reader 210 and an image forming apparatus body 310, and the image forming apparatus body 310 includes a controller 320 and a printer engine 330. The controller 320 has a CPU 321 and an image processor 322. In other words, the image forming apparatus 300 includes the printer engine 330 in addition to the image reading device 200 in FIG. 20.

The CPU 321 controls the entire operation of a system including the printer engine 330 and the image capturing device 211. The printer engine 330 is an image forming unit that forms an image on a recording medium.

In the example of FIG. 21, the controller 320 is shared by the reader 210 and the printer engine 330, which is only one example. Alternatively, the printer engine 330 may include a dedicated CPU for forming an image or a separate image forming unit. In some examples, the image forming apparatus 300 may further include a control panel in addition to the configuration illustrated in FIG. 21.

The image capturing device 211 incorporating the photoelectric conversion chip according to an embodiment of the present disclosure achieves a reduction in noise while reducing the layout area, which further minimizes color unevenness in images read by the reader 210 and achieves downsizing of the device itself. Alternatively, such an image capturing device 211 incorporating the photoelectric conversion chip according to an embodiment of the present disclosure achieves a reduction in space within the image capturing device 211 and provides space for a device having another function within the image forming apparatus body 310.

Although the preferred embodiments of the present disclosure have been described in detail above, the present disclosure is not limited to such specific embodiments, and various modifications and changes can be made within the scope of the gist of the embodiment of the present disclosure described in the claims.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

The invention claimed is:

1. A photoelectric conversion device comprising:
   a photoelectric conversion block including two-dimensionally arranged photoelectric converters, each photoelectric converter including a color filter and a photoelectric conversion element configured to perform photoelectric conversion in response to incident light;
   a signal processing block configured to process data output from the photoelectric conversion block; and
   a plurality of electrode pads disposed in the signal processing block, the electrode pads configured to supply power to the photoelectric conversion block and the signal processing block, wherein
      at least one electrode pad of the plurality of electrode pads supplies power to the signal processing block via a wiring line.

2. The photoelectric conversion device according to claim 1, wherein the signal processing block includes:
   an amplifier block configured to amplify a signal output from the photoelectric conversion block; and
   an analog digital (AD) conversion block configured to convert alternating current into direct current, and wherein a first group of electrode pads of the plurality of electrode pads supply power to the AD conversion block, and at least one of the first group of electrode pads is disposed adjacent to or within the AD conversion block.

3. The photoelectric conversion device according to claim 2, wherein
a second group of electrode pads of the plurality of electrode pads supply power to the photoelectric conversion block, and
the first group of electrode pads and the second group of electrode pads do not share the same electrode pads.

4. The photoelectric conversion device according to claim 1, wherein
the signal processing block includes two signal processing blocks each including the plurality of electrode pads, and the photoelectric conversion device is rectangular, and
the photoelectric conversion block is disposed between the two signal processing blocks in a shorter-side direction of the photoelectric conversion device.

5. The photoelectric conversion device according to claim 4, wherein
the plurality of electrode pads in each of the two signal processing blocks are disposed symmetrically about the photoelectric conversion block in a longer-side direction of the photoelectric conversion device.

6. The photoelectric conversion device according to claim 1, wherein
the photoelectric conversion device is a rectangular integrated circuit (IC) chip, and
the photoelectric conversion block and the signal processing block are each composed of laminated layers,
each of the plurality of electrode pads is disposed at a recessed area of the laminated layers in the signal processing block and is separated from a longer-side end of the IC chip in a shorter-side direction of the IC chip by 100 or more times a distance between a top surface of each of the plurality of electrode pads and a top edge of the laminated layers in the photoelectric conversion block.

7. The photoelectric conversion device according to claim 1, wherein
the photoelectric conversion device is rectangular, and
the photoelectric conversion block and the signal processing block are each composed of laminated layers,
each of the plurality of electrode pads is disposed at a recessed area of the laminated layers in the signal processing block and is separated from the photoelectric conversion block in a shorter-side direction of the photoelectric conversion device by 100 or more times a distance between a top surface of each of the plurality of electrode pads and a top edge of the laminated layers in the photoelectric conversion block.

8. The photoelectric conversion device according to claim 1, further comprising
peripheral circuits, between which the photoelectric conversion block is disposed in a longer-side direction of the photoelectric conversion device, each of peripheral circuits including an electrode pad, wherein
the photoelectric conversion device is rectangular, and
the plurality of electrode pads in the signal processing block supplies power to the photoelectric conversion block in the shorter-side direction of the photoelectric conversion device, and the electrode pad in each of the peripheral circuits supplies power to the photoelectric conversion block in the longer-side direction of the photoelectric conversion device.

9. The photoelectric conversion device according to claim 8, wherein
the signal processing block, the photoelectric conversion block, and the peripheral circuits are each composed of laminated layers, and
the electrode pad in each of the peripheral circuits is disposed at a recessed area of the laminated layers and is separated from the photoelectric conversion block in the longer-side direction of the photoelectric conversion device, by 100 or more times a distance between a top surface of the electrode pad and a top edge of the laminated layers in the photoelectric conversion block.

10. An image reading device comprising:
a light source configured to emit light to a document; and
the photoelectric conversion device according to claim 1 configured to perform photoelectric conversion on light reflected from the document.

11. An image forming apparatus comprising:
a light source configured to emit light to a document;
the photoelectric conversion device according to claim 1 configured to perform photoelectric conversion on light reflected from the document; and
a printer engine configured to form an image based on data output from the photoelectric conversion device.

12. A photoelectric conversion device comprising:
a photoelectric conversion block including two-dimensionally arranged photoelectric converters, each photoelectric converter including a color filter and a photoelectric conversion element configured to perform photoelectric conversion in response to incident light;
a signal processing block configured to process data output from the photoelectric conversion block; and
a plurality of electrode pads disposed in the signal processing block, the electrode pads being configured to supply power to the photoelectric conversion block and the signal processing block, wherein
the plurality electrode pads are connected to external electrode pads that are external to the signal processing block via wiring lines.

13. An image reading device comprising:
a light source configured to emit light to a document; and
the photoelectric conversion device according to claim 12 configured to perfotiii photoelectric conversion on light reflected from the document.

14. An image forming apparatus comprising:
a light source configured to emit light to a document;
the photoelectric conversion device according to claim 12 configured to perform photoelectric conversion on light reflected from the document; and
a printer engine configured to form an image based on data output from the photoelectric conversion device.

15. A photoelectric conversion device comprising:
a photoelectric conversion block including two-dimensionally arranged photoelectric converters, each photoelectric converter including a color filter and a photoelectric conversion element configured to perform photoelectric conversion in response to incident light;
a signal processing block configured to process data output from the photoelectric conversion block, the signal processing block including an analog digital (AD) conversion block configured to convert alternating current into direct current; and
a plurality of electrode pads disposed in the signal processing block, the electrode pads being configured to supply power to the photoelectric conversion block and the signal processing block, and disposed adjacent to the AD conversion block.

16. An image reading device comprising:

a light source configured to emit light to a document; and the photoelectric conversion device according to claim 15 configured to perform photoelectric conversion on light reflected from the document.

17. An image forming apparatus comprising:

a light source configured to emit light to a document;

the photoelectric conversion device according to claim 15 configured to perform photoelectric conversion on light reflected from the document; and a printer engine configured to form an image based on data output from the photoelectric conversion device.

* * * * *